(12) United States Patent
Slafer

(10) Patent No.: US 7,833,389 B1
(45) Date of Patent: Nov. 16, 2010

(54) REPLICATION TOOLS AND RELATED FABRICATION METHODS AND APPARATUS

(75) Inventor: W. Dennis Slafer, Arlington, MA (US)

(73) Assignee: Microcontinuum, Inc., Cambridge, MA (US)

( * ) Notice: Subject to any disclaimer, the term of this patent is extended or adjusted under 35 U.S.C. 154(b) by 1088 days.

(21) Appl. No.: 11/509,288

(22) Filed: Aug. 24, 2006

Related U.S. Application Data

(63) Continuation-in-part of application No. 11/337,013, filed on Jan. 20, 2006, now Pat. No. 7,674,103.

(60) Provisional application No. 60/645,714, filed on Jan. 21, 2005, provisional application No. 60/777,138, filed on Feb. 27, 2006.

(51) Int. Cl.
*C25D 1/02* (2006.01)

(52) U.S. Cl. .......................... 204/237; 204/272; 205/69

(58) Field of Classification Search ........................ None
See application file for complete search history.

(56) References Cited

U.S. PATENT DOCUMENTS

| | | | | |
|---|---|---|---|---|
| 2,706,175 | A | * | 4/1955 | Licharz ........................ 204/272 |
| 4,102,756 | A | * | 7/1978 | Castellani et al. ............. 205/82 |
| 4,125,447 | A | | 11/1978 | Bachert |
| 4,286,860 | A | | 9/1981 | Gursky et al. |
| 4,309,455 | A | * | 1/1982 | Miyagawa ................... 205/114 |
| 4,372,829 | A | * | 2/1983 | Cox ............................ 205/566 |
| 4,478,769 | A | | 10/1984 | Pricone et al. |
| 4,871,623 | A | * | 10/1989 | Hoopman et al. ............ 428/586 |
| 4,923,572 | A | * | 5/1990 | Watkins et al. ................ 205/69 |
| 5,147,763 | A | | 9/1992 | Kamitakahara |
| 5,496,463 | A | * | 3/1996 | Mori et al. ................... 205/109 |
| 5,521,030 | A | | 5/1996 | McGrew |
| 5,872,758 | A | | 2/1999 | Put et al. |
| 5,874,363 | A | | 2/1999 | Hoh et al. |
| 6,017,657 | A | * | 1/2000 | Mentz et al. .................... 430/1 |

(Continued)

FOREIGN PATENT DOCUMENTS

EP          0889366          1/1999

(Continued)

OTHER PUBLICATIONS

Supplementary European Search Report for related EP Application No. 06 71 9038, Feb. 2009.

(Continued)

*Primary Examiner*—Harry D Wilkins, III
(74) *Attorney, Agent, or Firm*—McDermott Will & Emery LLP

(57) ABSTRACT

Durable replication tools are disclosed for replication of relief patterns in desired media, for example in optical recording or data storage media. Methods of making such durable replication tools are disclosed, including recording and developing a relief pattern on a selected surface of a support cylinder, creating a durable layer with a complementary relief replica of the pattern, separating the durable layer from the support cylinder. Apparatus are disclosed for fabricating such replication tools, including systems and apparatus for recording a desired relief pattern on a surface of a support cylinder. Also disclosed are electro deposition cells for forming a durable tool sleeve having a desired relief pattern. The replication tool relief features may have critical dimensions down to the micron and nanometer regime.

13 Claims, 19 Drawing Sheets

U.S. PATENT DOCUMENTS

| | | | |
|---|---|---|---|
| 6,045,980 | A | 4/2000 | Edelkind et al. |
| 6,113,769 | A * | 9/2000 | Uzoh et al. ............ 205/101 |
| 6,183,610 | B1 * | 2/2001 | Kataoka et al. ......... 204/272 |
| 6,222,157 | B1 | 4/2001 | Langille et al. |
| 6,258,251 | B1 * | 7/2001 | Gowans et al. .......... 205/771 |
| 6,309,799 | B1 | 10/2001 | Ruckl |
| 6,790,377 | B1 | 9/2004 | Cohen |
| 2001/0038072 | A1 | 11/2001 | Aumond et al. |
| 2005/0069480 | A1 | 3/2005 | Huang et al. |
| 2005/0167276 | A1 * | 8/2005 | Stilli ..................... 205/103 |
| 2005/0274693 | A1 | 12/2005 | Heidari et al. |
| 2006/0283539 | A1 | 12/2006 | Slafer |

FOREIGN PATENT DOCUMENTS

| | | | |
|---|---|---|---|
| JP | 57-143484 A | * | 9/1982 |
| WO | 9006234 | | 6/1990 |
| WO | 2006078918 | | 7/2006 |

OTHER PUBLICATIONS

Definition of Lathe, from Answers.com; 2009.

International Search Report for corresponding PCT Application No. PCT/US20078/076708, 3 PP, Nov. 2008.

Written Opinion for related corresponding Application No. PCT/US20078/076708, 10 PP, Oct. 2008.

International Search Report and Written Opinion from PCT Application No. PCT/US2009/31876.

* cited by examiner

REPLICATION TOOLS AND RELATED FABRICATION METHODS AND APPARATUS

RELATED APPLICATIONS

This application is a continuation-in-part of U.S. application Ser. No. 11/337,013 filed 20 Jan. 2006 now U.S. Pat. No. 7,674,103, which claims the benefit of U.S. Provisional Application No. 60/645,714 filed 21 Jan. 2005, the contents of both of which are incorporated herein in their entirety by reference. This application is also related to U.S. Provisional Application No. 60/777,138 filed 27 Feb. 2006, the contents of which are incorporated herein in their entirety by reference.

BACKGROUND

Optical data storage media including compact discs (CDs) and digital video discs (DVDs) typically contain physical relief structures that are used by an optical read/write head to obtain position and tracking information, error correction, conveying data content, etc. These relief structures are created during the manufacturing process of the particular optical medium and typically include very fine modulations on a surface of the optical medium. The surface modulations are often in the form of pits, bumps, grooves, or lands, etc., and can include features with submicron-scale down to nanometer-scale dimensions. The process of incorporating such features into the substrate of the optical medium during manufacturing is variously referred to as "preformatting" or "replication." The benefits of preformatting include very efficient utilization of the optical medium (e.g., disc) surface, which in turn allows higher storage capacity and enhanced performance compared to media without such formatting.

The standard process for incorporating such information structures into the surface of optical disc substrates is injection molding, wherein pellets of a polymeric material, usually polycarbonate, are melted and injected into a mold containing an insert, or stamper, which has the mirror image of the desired pattern on its surface and against which the melted polymeric substrate material is brought into contact. Cooling of the mold allows the polymer material to solidify, at which point the substrate disc, now having the information formed into its surface, is removed.

In the case of optical media designed for recording/rewriting of user data, the molded features typically contain various format and header addressing information to help locate the user data, and additionally may contain other features, including those relating to prerecorded information, often referred to as read-only memory (ROM) information.

Although the injection molding process described above is the virtually exclusive manufacturing process used worldwide for making optical discs, a number of attempts have been made to fabricate data storage substrates by means other than injection molding, including continuous roll processing. Continuous roll-to-roll (R2R) techniques have been used in a number of manufacturing areas, including photographic film, paper and plastic, graphic arts, holographic and light control films, etc. For an article on continuous roll processing, see W. D. Slafer at al., "Continuous Web Manufacturing of thin-coverslip optical media", SPIE Optical Data Storage '92, San Jose, Calif., 12 Feb. 1992. Such roll-to-roll (R2R) processes have involved a rotary or step-and-repeat replication process, either of which utilizes a replication tool whose surface contains the mirror image of the desired pattern, and which is used to create multiple replicas of the tool pattern.

There are a number of techniques known in the art whereby embossing tools used in the R2R processes can be created, including direct etching on the external surface of the tool, or use of a flat substrate that is attached to the outer surface of a support member, patterned or patterned after mounting. See, for example, U.S. Pat. No. 5,521,030 and U.S. Pat. No. 5,147,763. It is further known that such tooling can be formed from discrete elements, whereby several substrates containing a pattern to be replicated can be joined, as in the form of a mosaic pattern, for example, and thereby increase the size of the tool.

Many of the techniques of the prior art described previously include the inevitable creation of one or more joints or seams at the location(s) where substrate edges abut. The resulting master replication tool exhibits a discontinuity or seam at the location at which the discrete pieces are joined. Such seams do not represent a limitation in applications in which the desired pattern to be replicated is by design composed of discreet elements such as discs and cards, since the seams can merely be placed between the natural divisions of these discrete elements. For other applications, the visual effects of the seams can be reduced by techniques known in the art so as not to be noticeable or objectionable for a particular application, for example holographic designs or embossed foils for wrapping and packaging and the like. The discontinuities introduced by the existence of one or more seams, however, can present limitations in other applications in which a recording medium requires a format with a relatively long dimension compared to the replication tool, e.g., such as optical storage tape.

In addition to cosmetic effects, a discontinuity such as a seam that is made by the replication tool can often cause mechanical problems during the replication process, and techniques known in the art have been developed to reduce the seam, including careful piecing of the segments, grinding, polishing, etc. For some applications, such techniques are not acceptable, for example micropatterns that require a pattern without interruption for long distances, such as lenticules for photographic films and preformatted recording tape. See E. H. Land, "An Introduction to Polavision," Photogr. Sci. Eng. 21: 225 (1977).

Examples of previous techniques of producing true seamless patterning tools have involved producing a mirror image of the desired pattern on the external face of a geometric surface, such as a drum, by engraving or by lithographic techniques, e.g., as taught in U.S. Pat. No. 6,045,980. These previous techniques, however, suffer from the drawback that the replica surface is often made of materials that are not durable (glass, photopolymer, etc.) or cannot be readily replicated. A direct (molded) copy of such an external master pattern would by necessity have the pattern facing inward, and attempting to "invert" such a tool, for example by slitting to turn it "inside out," would by necessity introduce a seam.

Other examples of processes for making replication tools suitable for optical recording media involve spiral wrapping of a discreet tape over the outer surface of a sleeve to create an external pattern. See, for example, U.S. Pat. No. 5,872,758. This technique does not eliminate discontinuities, however, and suffers from the limitation of creating multiple diagonal seams on the substrate being imprinted.

What are desirable, therefore, are methods and apparatus that address the shortcomings noted for the prior art.

SUMMARY

The present disclosure is directed to methods and apparatus that substantially or altogether eliminate the shortcomings, limitations and disadvantages described previously. Certain embodiments of the present disclosure are directed to durable replication tools having a cylindrical surface that includes a seamless surface patterns for the formation or replication of predetermined continuous and seamless patterns useful for pre-formatting a desired recording substrate.

Such replication tools may include a seamless cylindrical substrate ("SCS") holding a desired three-dimensional relief pattern. The three-dimensional relief pattern of the SCS is complimentary or substantially complimentary to a three-dimensional relief pattern formed on a selected surface of a support cylinder.

The recording substrate can be rigid or flexible. In certain embodiments, the recording substrate can include a layer of liquid polymer that can be cured or hardened to receive or hold a complimentary pattern based on the predetermined seamless pattern of the replication tool.

Other embodiments of the present disclosure are directed to related methods and apparatus for fabricating such seamless replication tools, including chemical deposition cells, fluid delivery systems, centralizing fixtures, and differential thermal expansion/contraction methods/apparatus.

Exemplary embodiments of continuous and seamless durable replication tools as described herein may provide the capability of forming a continuous pattern capable of having features with critical dimensions down to the micron and nanometer regimes on a substrate of arbitrary length, e.g., a substrate for preformatted tape, and the like.

These and other features of the present disclosure will be more clearly apparent from the following description when taken in conjunction with the accompanying drawings.

BRIEF DESCRIPTION OF THE DRAWINGS

Various aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

DETAILED DESCRIPTION

Figure 1:
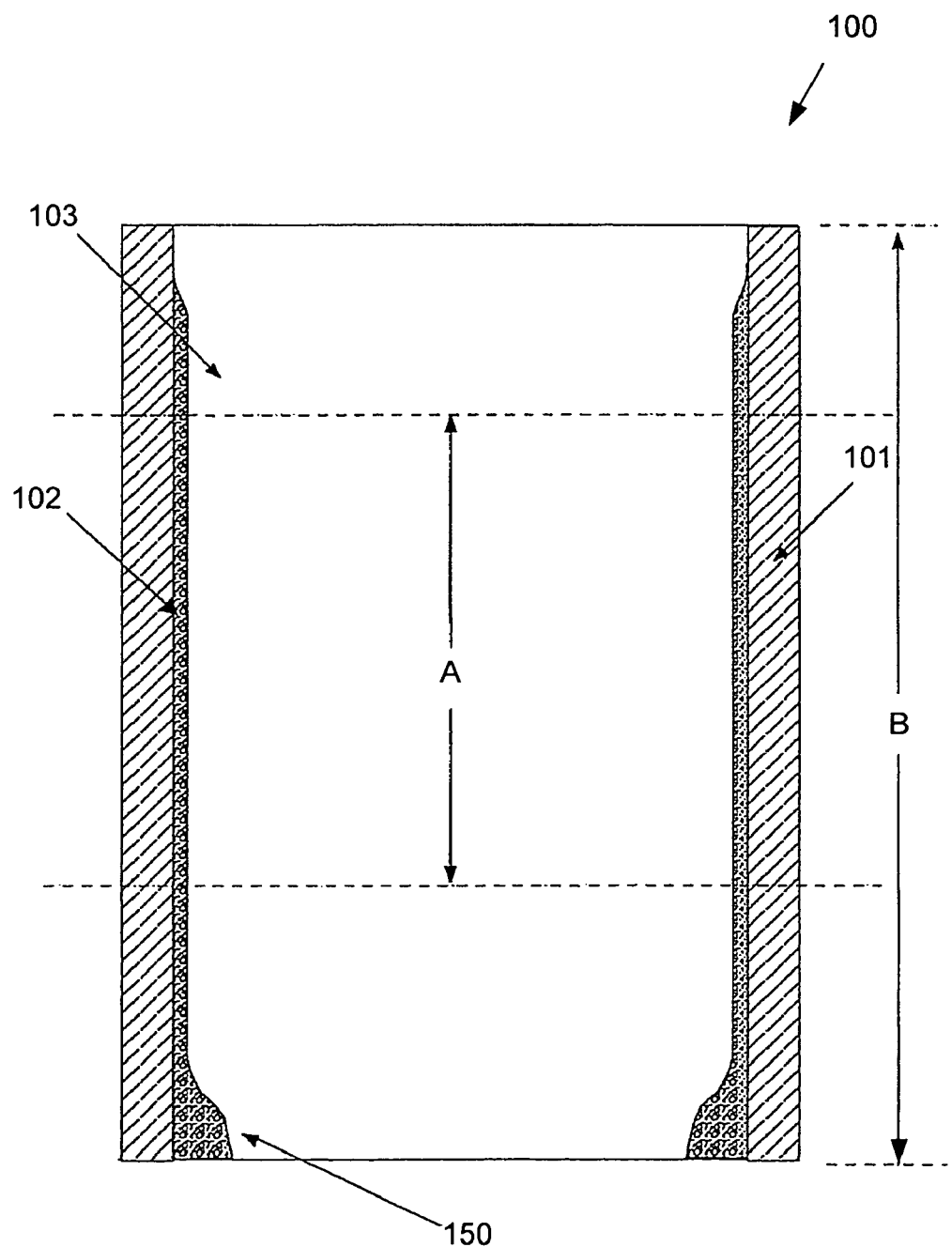
FIG. 1 is a schematic drawing depicting a cross section of a support cylinder having a photosensitive layer on an inner surface, in accordance with an embodiment of the present disclosure.

The following description refers to several possible embodiments of the present disclosure. It should be understood by one skilled in the art that variations of the embodiments described herein may be envisioned and practiced within the scope of the disclosure.

Embodiments of the present disclosure are directed to pattern replication tools, or master drums, and related fabrication methods and apparatus useful for making and copying seamless cylindrical substrates ("SCS"). Formation of a replication tool can include the use of a cylindrical surface that includes a seamless surface patterns for the formation or replication of predetermined continuous and seamless patterns useful for pre-formatting a desired recording substrate. The cylindrical surface may be a selected inner or outer radial surface of a support cylinder. Such master drums, or replication tools, can provide the ability to relatively quickly and inexpensively make copies of one or more master patterns used in the manufacturing of recording media.

The replication tools can have one or more desired or predetermined three-dimensional relief patterns that are suitable for imprinting or embossing the relief pattern(s) in various media including optical storage media. The relief patterns of the replication tools are formed as three-dimensional patterns that are complementary, or substantially complimentary, to relief patterns of a selected surface of a support cylinder. The selected surface of a support cylinder can be the inner or outer radial surface relative to the longitudinal axis of the cylinder.

The relief patterns themselves can be predetermined, pseudorandom, or random, and the surfaces can be seamless. A relief pattern may be formed by suitable techniques including, but not limited to, direct writing contact or projection lithography, physical contact with another pattern, or other suitable techniques.

In exemplary embodiments, the relief pattern(s) of the support cylinder can be formed or recorded in a substrate material that has been applied to the selected surface of the support cylinder. Exemplary embodiments of continuous and seamless durable replication tools as described herein may provide the capability of forming a continuous pattern with features having critical dimensions down to the micron and nanometer regime on a substrate of arbitrary length, e.g., a substrate for preformatted optical tape, and the like.

Further embodiments of the present disclosure are directed to apparatus for fabricating such seamless master drums or replication tools. Certain embodiments are directed to systems that utilize a radiation source to record a desired relief pattern on a radiation-sensitive layer on a selected surface of a support cylinder. Further embodiments of the present disclosure are directed to chemical deposition cells for plating a support cylinder having a relief pattern and forming a durable tool sleeve having a complimentary relief pattern.

Exemplary embodiments of the present disclosure are directed to techniques for applying requisite materials to the internal or external surface of a support cylinder prior to pattern formation, and, where required, developing this layer after pattern exposure. Coated materials for pattern formation may include, but are not limited to, photoresists, metals, alloys, compounds, and polymeric layers.

Further embodiments of the present disclosure are directed to apparatus and methods for forming multiple generations (i.e., copies or replicas) from an original patterned cylinder. This may be useful if, for example, the initial pattern is formed internally or from a material that is fragile or incompatible with the physical or chemical conditions of the replication process. By making multiple generations of tools from a single original or master pattern, the time-consuming and expensive process of producing original master patterns may be minimized.

FIG. 1 is a schematic drawing depicting a cross section of a support cylinder having a recording layer on an inner surface, in accordance with an embodiment 100 of the present disclosure. The support cylinder 101 forms a bore 103, and may be made of a suitable strong and rigid material such as glass, metal, plastic, etc. In preferred embodiments, the cylinder is devoid of surface seams, i.e., is seamless, or substantially so. A selected surface of the support cylinder 101, e.g., the inner surface as shown, may be coated with a layer of suitable material to form a substrate 102 that can be used for recording a desired or predetermined relief pattern. In exemplary embodiments, substrate 102 includes a radiation-sensitive material such as a light-sensitive polymer (such as Shipley AZ photoresist, or the like).

In FIG. 1, distance "A" is representative of a portion of substrate 102 that has substantially uniform thickness when compared to the thickness of the substrate 102 along the overall length "B" of the support cylinder 101. Distance B (or overall length) of the cylinder 101 may be made longer than the desired final length of the uniform section A to take into account any coating thickness non-uniformity at the top and bottom areas of the cylinder, e.g., section 150. The non-uniform sections of the cylinder may be removed and discarded leaving a support cylinder with substrate 102 of substantially uniform thickness along the length of the cylinder.

Substrate 102 can be applied by any of a number of techniques, including but not limited to dipping the cylinder 101 in a bath or reservoir of the substrate material, drawing the cylinder 101 out of such a bath, draining the bath at a desired rate, spraying substrate material onto one end of the support cylinder 101, and/or spinning the support cylinder 101 to spread the substrate material, etc.

In exemplary embodiments, at least one of the layers or surfaces of the support cylinder includes a material or substrate that is sensitive to the application of incident energy (e.g., actinic radiation, electrons, ions, or heat, and the like). The radiation-sensitive material can include one or more layers or regions of photoresist, such as those used for typically used in optical or e-beam lithography. Suitable photoresists can be of the positive or negative types. Positive photoresists are weakened by exposure to the incident energy, facilitating a "positive" pattern resulting from removal of the exposed (and thus weakened) areas of the resist. Conversely, negative photoresists are strengthened by the incident energy, facilitating a "negative" pattern resulting from removal of the unexposed areas of the resist. In exemplary embodiments, for example, so-called Shipley photoresists may be used, though other suitable types may likewise be used.

In exemplary embodiments, the substrate material 102 may be applied to the top rim of the support cylinder (preferably below the edge to prevent dripping) in sufficient quantity to form a continuous liquid film covering the inner surface of the cylinder, then allowed to drain down by gravity. The thickness and uniformity of the substrate material (e.g., photoresist) may be controlled, for example, by control of the viscosity of the coating fluid (adjusted by the use of one or more diluents), the evaporation rate of the diluent(s), among other factors. In exemplary embodiments including use of a photoresist, pre-bake and other steps typically used with photoresists may be followed in order to prepare the resist for subsequent exposure.

In certain embodiments, a substrate 102 can include an ablative material, such as a polymer, metal, or alloy (e.g., tellurium or a tellurium alloy) that can be vaporized or physically deformed by the action of the incident energy (e.g., optical radiation). In further embodiments, the substrate 102 or pattern forming layer(s) can include a soft polymeric or metallic material that may be deformed by the action of a precision stylus (atomic force microscopy "AFM", etc.) or cutting tool or by suitable techniques including thermal embossing, chemical embossing, imprint lithography, or self-assembly, etc.

While FIG. 1 indicates that layer 102 is located on the inner surface of the support cylinder 101, the desired pattern may be formed on the outside surface of similar support cylinders in other embodiments. For such embodiments, e.g., including an externally patterned substrate, the support cylinder may be used directly as a production pattern replication tool in a manufacturing process, e.g., for pre-formatting optical recording media. Replication tools may also be formed from a replica of an original or master patterned tool.

Figure 2:
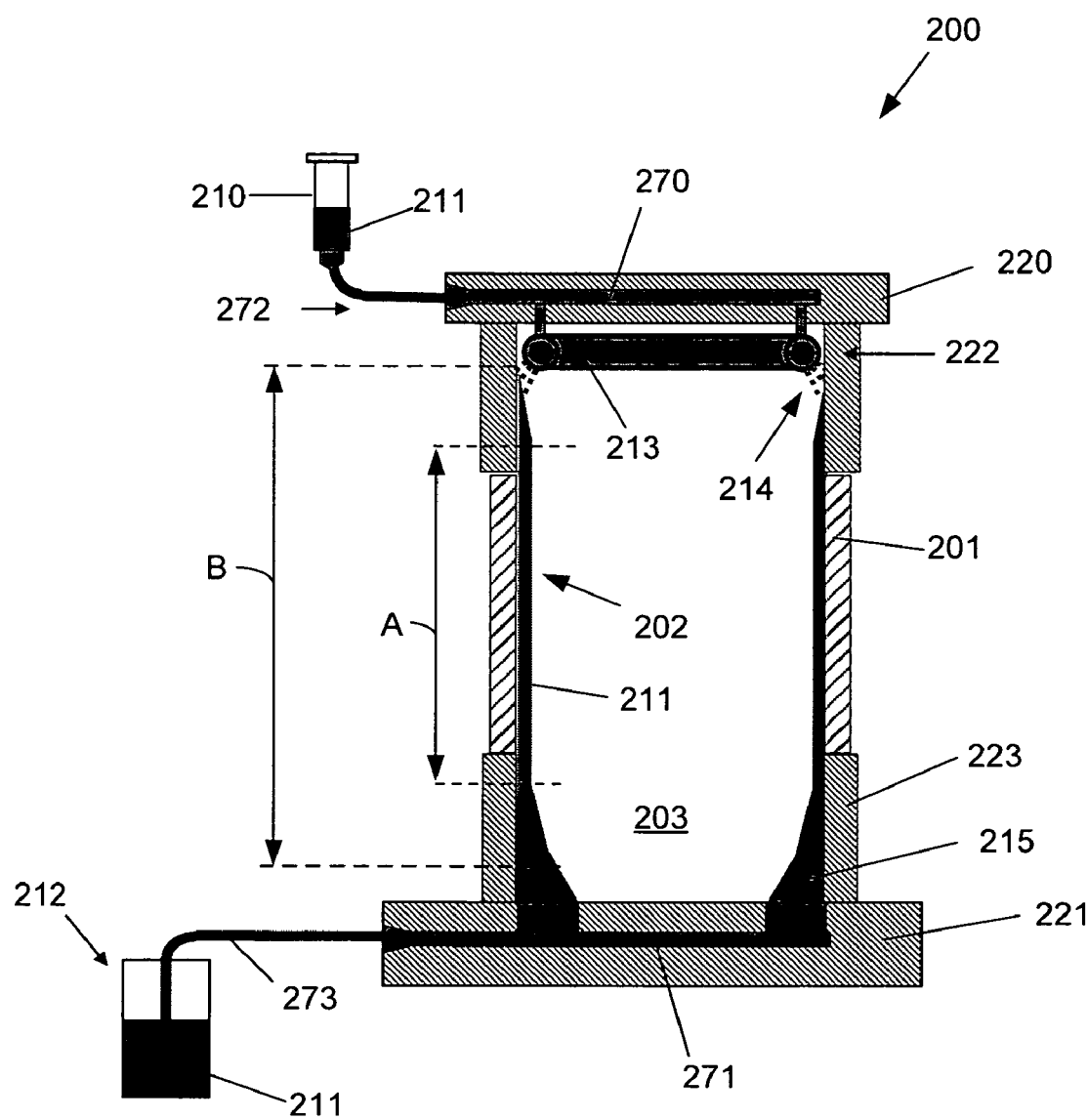
FIG. 2 is a schematic drawing depicting a cross section of a further embodiment for applying a liquid to an internal surface of a support cylinder.

FIG. 2 is a schematic drawing depicting a cross section of an apparatus 200 for applying a fluid, e.g., a liquid such a suitable substrate material, to a selected surface of a support cylinder 201, in accordance with further embodiments. As described previously for FIG. 1, the cylinder 201 may be made from a suitably strong and rigid material, e.g., glass, metal, plastic, etc.

The apparatus 200, or fixture, can include opposed first and seconds ends 220, 221 for holding the support cylinder 201. The first end 220 includes a first passageway 270 that is configured to receive a fluid 211 from a fluid supply, e.g., supply reservoir 210, possibly via external piping or passageways 272. A manifold 213 may be configured within the bore 203 of the cylinder 201 for receiving fluid 211 from the first end 220. Manifold 213 includes one or more orifices suitable for the distribution (shown as fluid spray 214) of the fluid 211 to a selected surface (e.g., the inner surface) of the support cylinder 201. The second end 221 may include one or more orifices to receive accumulated fluid 215 used for the coating of the cylinder surface. The second end 221 also includes a second passageway 271 that is configured to convey fluid 211 for removal from the support cylinder 201, possibly via external piping 273.

Also shown in FIG. 2 are a pair of cylindrical wall 222, 223 that act as holding means for holding the support cylinder 201 relative to the first and second ends 220, 221. The pair of cylindrical walls 222, 223 are disposed substantially along the same cylindrical surface, each one of the pair located at opposite ends of the support cylinder 201, with each wall having a lateral surface adapted to receive the support cylinder 201. Other suitable holding means may be used for support of the support cylinder, e.g., gasket configurations, etc. The fluid delivery apparatus 200 may also include a delivery manifold 213 that is connected to one end, e.g., end 220, with a suitable number and configuration of orifices to deliver the fluid 211 to a surface of the support cylinder 201 to form a substrate 202. In FIG. 2, similar to FIG. 1, height "A" is representative of a portion of substrate 202 that has substantially uniform thickness when compared to the thickness of the substrate 202 along the fluid application height "B" including portions of holding means, e.g., bracketing cylindrical walls 222, 223. Once removed from the cylinder 201, fluid 211 may be directed to a desired location, e.g., a suitable reservoir 212.

The fluid (e.g., liquid) applied to the support cylinder 201 with the apparatus 200 may be selected as desired. For example, a photoresist polymeric material may be selected for some applications. Further, liquids including suitable polymers may be used to impart a planarizing effect on the cylinder 201. Planarization may be achieved by applying a suitable liquid (e.g., polymer) to even uneven surface features, thus reducing or eliminating the effects of scratches, roughness due to intrinsic crystal structure, and/or mechanical surface roughness. In certain embodiments, multiple liquid application steps may be performed using apparatus 200. For example, apparatus 200 may be used with a first liquid 211 to apply a first coating that primarily planarizes and reduces defects in the selected surface of the cylinder 201 and a second, subsequent coating including a photosensitive layer in then applied on the first planarizing layer.

Figure 3:
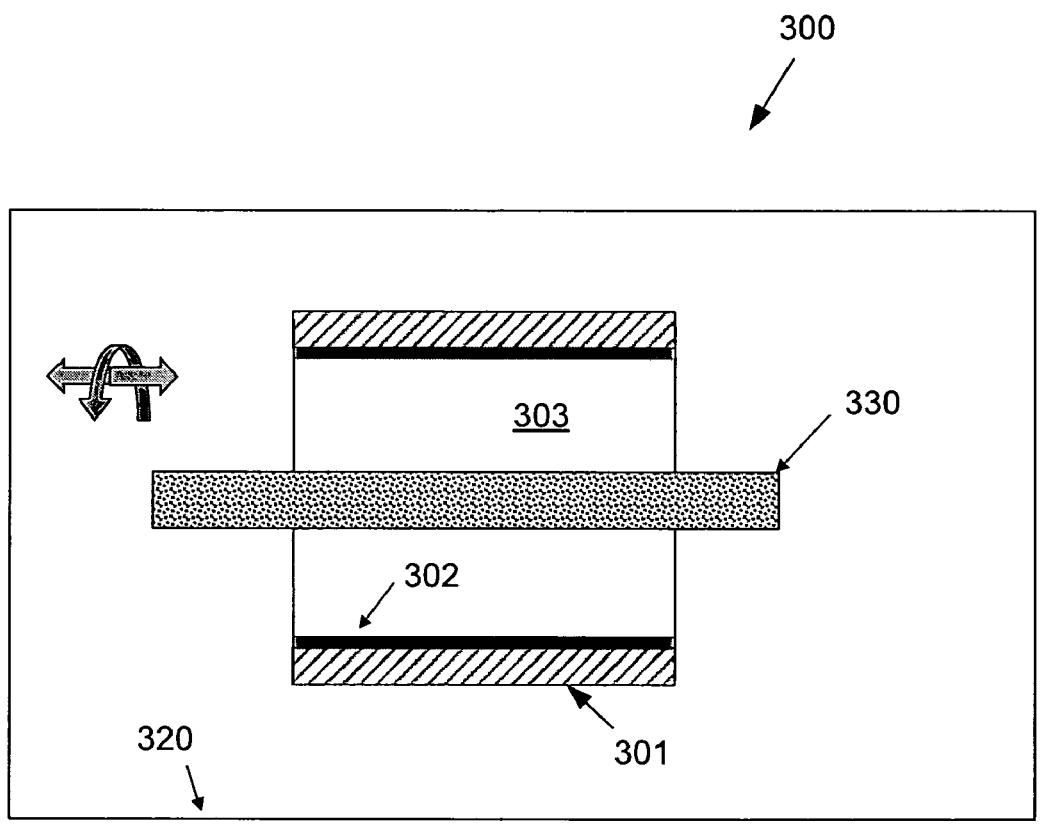
FIG. 3 is a schematic drawing depicting a cross section of a further embodiment for vacuum deposition of a recording layer on a inner surface of a support cylinder.

In addition to embodiments according to FIG. 2, material and layers for recording (or holding) a desired relief pattern may be added to a support cylinder used for replication or preformatting, e.g., cylinder 101, by suitable methods and apparatus. FIG. 3 is a schematic drawing depicting a cross section an apparatus 300 for vacuum deposition of a recording layer or substrate 302 on a inner surface of a support cylinder 301, in accordance with a further embodiment.

The apparatus 300 includes a vacuum chamber 320 in which the support cylinder 301 can be placed. A sputter cathode or evaporation wire 330 may be positioned through the bore 303 formed by the support cylinder 301. The configuration of the evaporation wire 330 and support cylinder 301 facilitates uniform coating of the inner surface of the cylinder 301 with a desired material.

The apparatus of FIG. 3 may be used to uniformly coat a metal, alloy, compound, polymer, photopolymer, etc., layer to the inside surface of the cylinder 301. The uniformity of the deposit may be improved by the rotation and/or translation of the cylinder 301 and/or source (e.g., sputter cathode), as well as by using appropriate aperture shields during the deposition process (not shown). In alternate embodiments, method/apparatus analogous to that shown in FIG. 3 may be used to coat an external surface of a cylinder in order to form an externally-patterned cylinder.

Figure 4A:
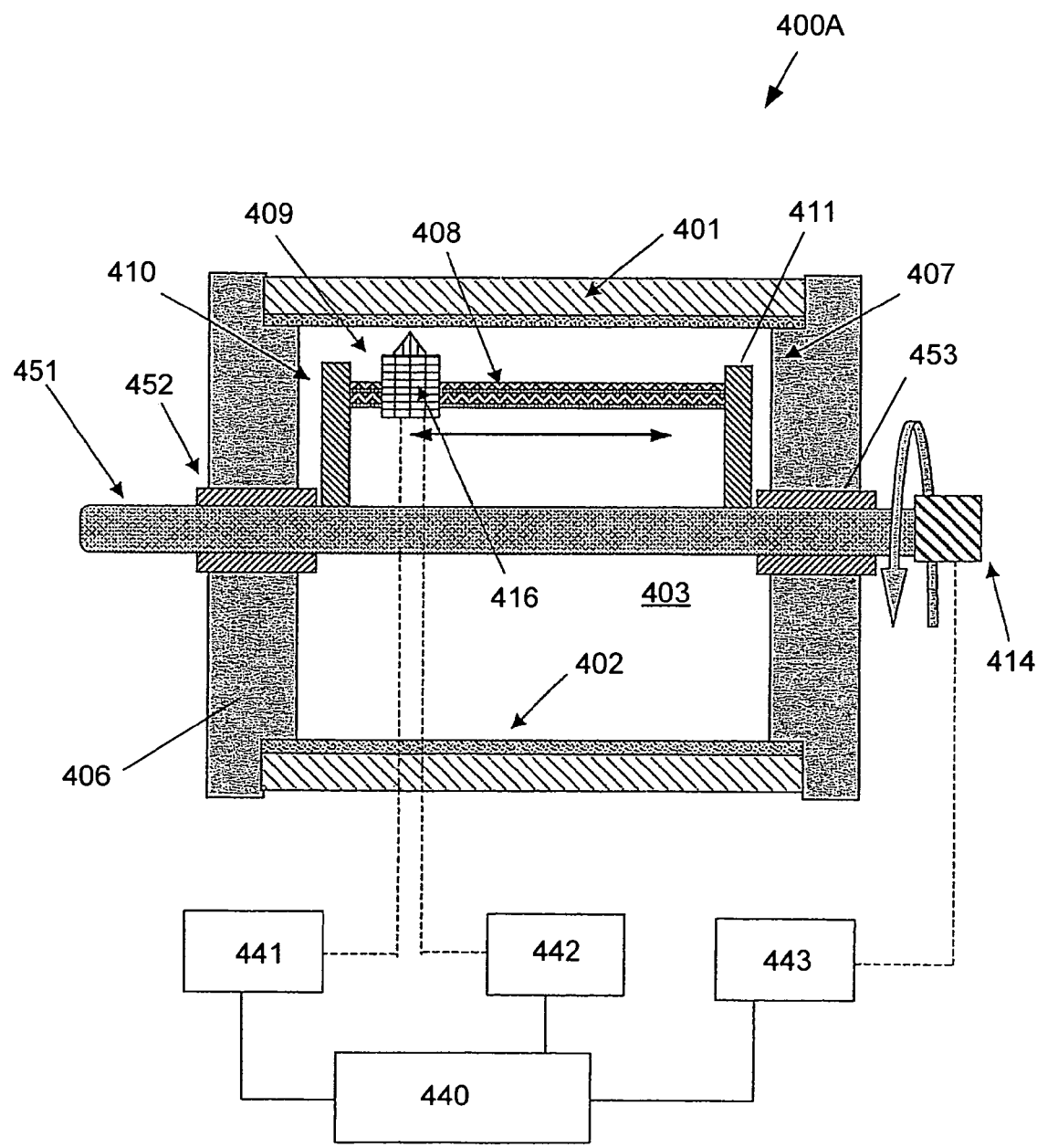
FIG. 4A is a schematic drawing depicting a cross section of a further embodiment including a movable radiation source for recording information-bearing features on an inner surface of a support cylinder.

FIG. 4A is a schematic drawing depicting a cross section of an apparatus 400A including a movable radiation source for recording information-bearing features on an inner surface of a support cylinder 401, in accordance with a further embodiment. The apparatus (or system) 400A can include a movable radiation head assembly 409 disposed within the bore 403 of the support cylinder. The head assembly 409 can include a radiation source for recording a desired pattern, e.g., information-bearing features, on a substrate 402 that has been applied to the inside surface of the support cylinder 401. One or more centralizing end bells, or disks, 406, 407 may be present for holding the head assembly within the cylinder 401. One or more support members may be present to support the support cylinder 401, and may be connected to the one or more end bells 406, 407. A support member in the form of a central shaft 451 extending through bearings 452, 453 may be used in exemplary embodiments. A motor 414 may be present for rotation of the shaft 451 To facilitate improved precision and accuracy in patterning, or pattern formation, the bearings 452, 453 may be air bearings in exemplary embodiments.

The apparatus 400A may include a frame, e.g., track 408 and legs 410, 411, to support movement of the radiation source 409 relative to the cylinder 401. For FIG. 4A, the frame is located within the bore 403 of the cylinder 401. In exemplary embodiments, the track 408 can be parallel or substantially parallel to the support shaft 451. The movable head assembly 409 can include an actuator 416 (e.g., a linear actuator) configured to move the radiation source along the track 408.

The radiation source used for assembly 409 may be a light source of any suitable wavelength and degree of coherence. In further embodiments, ion sources and/or e-beam sources may be used as the movable radiation source. In exemplary embodiments, a laser such a suitable semiconductor diode laser or a solid state laser is used for the movable radiation source. The output of the radiation source, e.g., a laser output beam, may be modulated by a suitable controller 441. The head assembly 409 may include autofocus and other control circuitry as necessary to maintain the position and uniformity of the produced radiation, e.g., optical output beam. The translation of assembly 409 by the linear actuator 416 may be controlled by a suitable position controller 442.

To produce relative movement between the head assembly 409 and the cylinder 401, the cylinder 401 may be rotated about its central shaft 451 while assembly 409 is simultaneously translated along the direction of the longitudinal axis of the cylinder 401. During such motion, the output of the radiation source of assembly 409 can be modulated to produce exposure of layer 402 according to the desired pattern. Smooth continuous motion of the radiation source, or its radiation, can be used to produce a spiral pattern, or other desired pattern(s) on/in the selected surface of the support cylinder 401. For example, intermittent rotation and translation of the radiation source relative to the selected surface of the support cylinder can be employed to produce concentric patterns.

Rotation, translation, and radiation output (e.g., laser beam intensity) control of assembly 409*a* may be synchronized and programmed through a master controller device 440. Example of a suitable master controller device 440 can include, but are not limited to suitable programmable logic controllers (PLCs), computers, suitable processors, field-programmable gate arrays (FPGAs), or the like. It may also be appreciated that alternative techniques for moving the radiation output with respect to the selected surface of a support cylinder, with any desired coating(s)/layer(s), may be used. For example, in certain embodiments, the radiation source or its output may be held steady while rotating and translating a support cylinder in a desired way. For further example, the radiation source or its output could be rotated while the cylinder 401 is translated to achieve writing/recording of the desired pattern. While FIG. 4A shows a radiation source configured and arranged to apply a desired pattern to an internal or inner surface of a support cylinder 401, other embodiments may include a radiation source configured and arranged to apply a desired pattern to an external surface of a support cylinder 401, as shown in FIG. 4B.

Figure 4B:
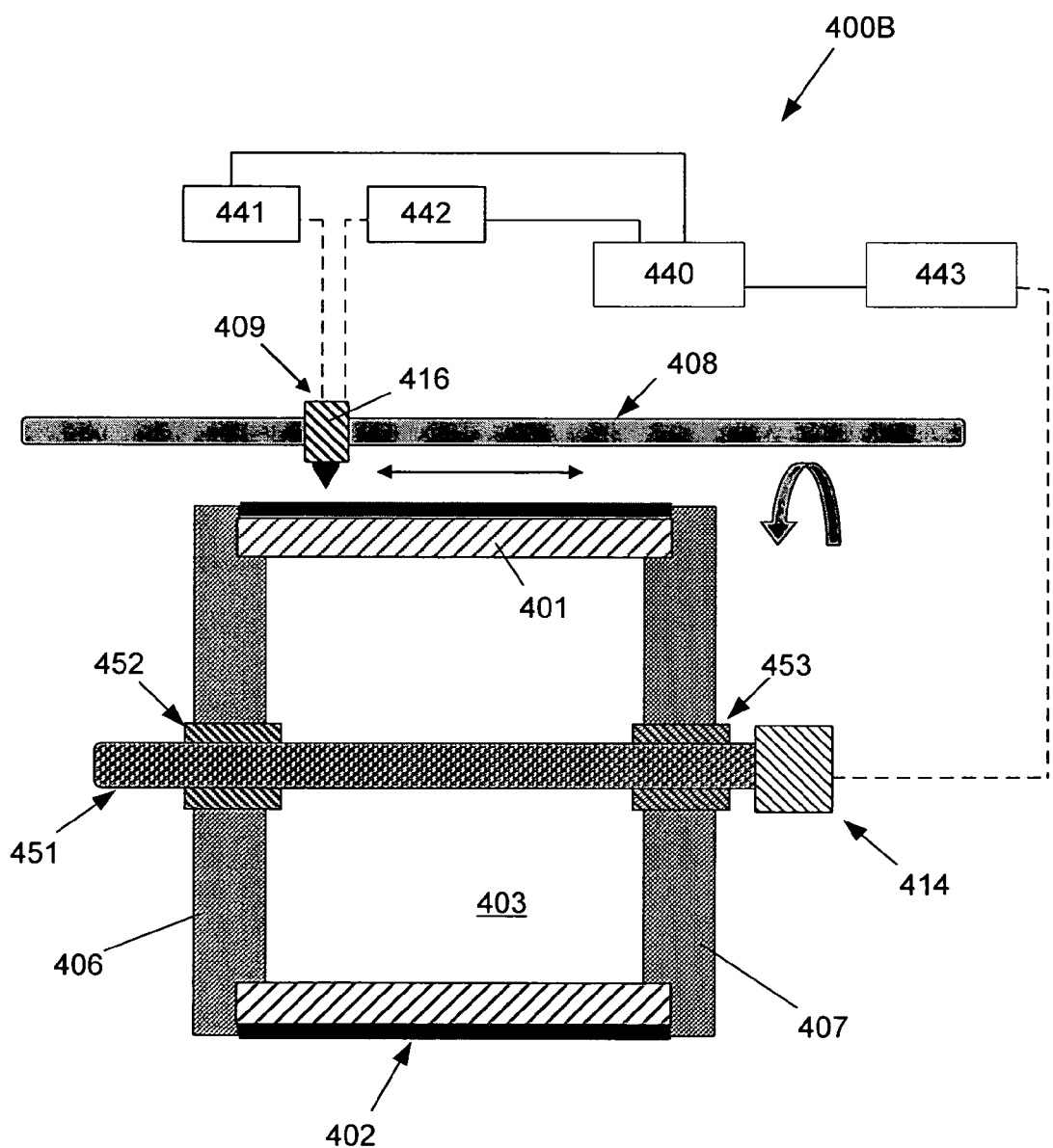
FIG. 4B is a schematic drawing depicting a cross section of a further embodiment including a movable radiation source for recording information-bearing features on an outer surface of a support cylinder.

FIG. 4B is a schematic drawing depicting a cross section of an apparatus 400B including a movable radiation source for recording information-bearing features on an outer surface of a support cylinder 401, in accordance with further embodiments. Apparatus 400B is similar to (and includes like numbering) apparatus 400A shown and described for FIG. 4A, however, the substrate layer 402 is disposed on the outer radial, or exterior, surface of the support cylinder 401. For this configuration, the movable radiation source assembly 409 is configured to move along a frame, e.g., track 408, that is located exterior to and in suitable proximity with the outer surface of the support cylinder 401.

In addition to the use of apparatus 400A-400B shown and described for FIGS. 4A-4B, other indirect writing techniques including lithography may be used to prepare a desired pattern in/on the selected surface of a support cylinder. Lithographic techniques may employ a photomask ("stencil"), either in direct contact with the substrate ("contact printing"), or by projecting the image of the pattern onto the substrate ("projection printing"). For such lithographic techniques, the selected surface (internal or external) of the cylindrical support cylinder is coated with a photosensitive layer, e.g., as shown in FIG. 2A, and radiation of an appropriate wavelength is used to expose the photosensitive layer through the photomask. The photoresist may subsequently be developed to obtain a desired relief pattern.

Other suitable indirect writing techniques can include holographic techniques in which a photoresist-coated cylinder is exposed to a standing wave pattern made by the interference of multiple laser beams. In such embodiments, a photomask may not be necessary, however, the ability to write certain types of patterns may as a consequence be impacted, since the laser interference pattern may have a high degree of spatial uniformity.

Besides indirect writing techniques, e.g., as described for FIGS. 4A-B, suitable direct writing techniques may be used to directly form a desired pattern in/on a selected surface of the support cylinder. For example, subtractive processing, such as laser ablation, may be utilized, where material is removed by the direct action of the radiation. Additive processing may also be used, where material is added to the support cylinder in a desired pattern. Examples of suitable additive techniques include, but are not limited to, embossing techniques including thermally-activated, chemically-activated, and radiation-activated embossing techniques as well as the use of ink jet printing or dip-pen lithography. A further technique may utilize a microstylus (e.g., using atomic force microscopy "AFM," micro-indenter, etc.) to form a pattern by disruption of the coated layer.

In embodiments utilizing embossing techniques to produce a cylindrical master pattern, a tool having the desired surface relief pattern (which can made by any number of techniques know in the art) may be placed into contact with the surface (internal or external) of the cylindrical substrate. By using thermal or chemical techniques, the substrate surface can be softened so that the relief pattern can be pressed into it. The relief pattern may be removed once the substrate surface is re-hardened (e.g., by returning the substrate surface to below its softening point). Alternatively, a liquid curable polymer can be applied to the substrate surface and caused to set exposure to radiation (thermal, optical) or as the result of a chemical ratio (epoxies). Numerous techniques known in the art, including the more recently developed Nano Imprint Lithography can be used in this regard.

The selection of a particular pattern writing technique (e.g., a direct or indirect technique) may be influenced by one or more factors, including the resolution achievable by the process relative to that required by the desired pattern, and the time required to write the desired pattern, etc.

Figure 5:
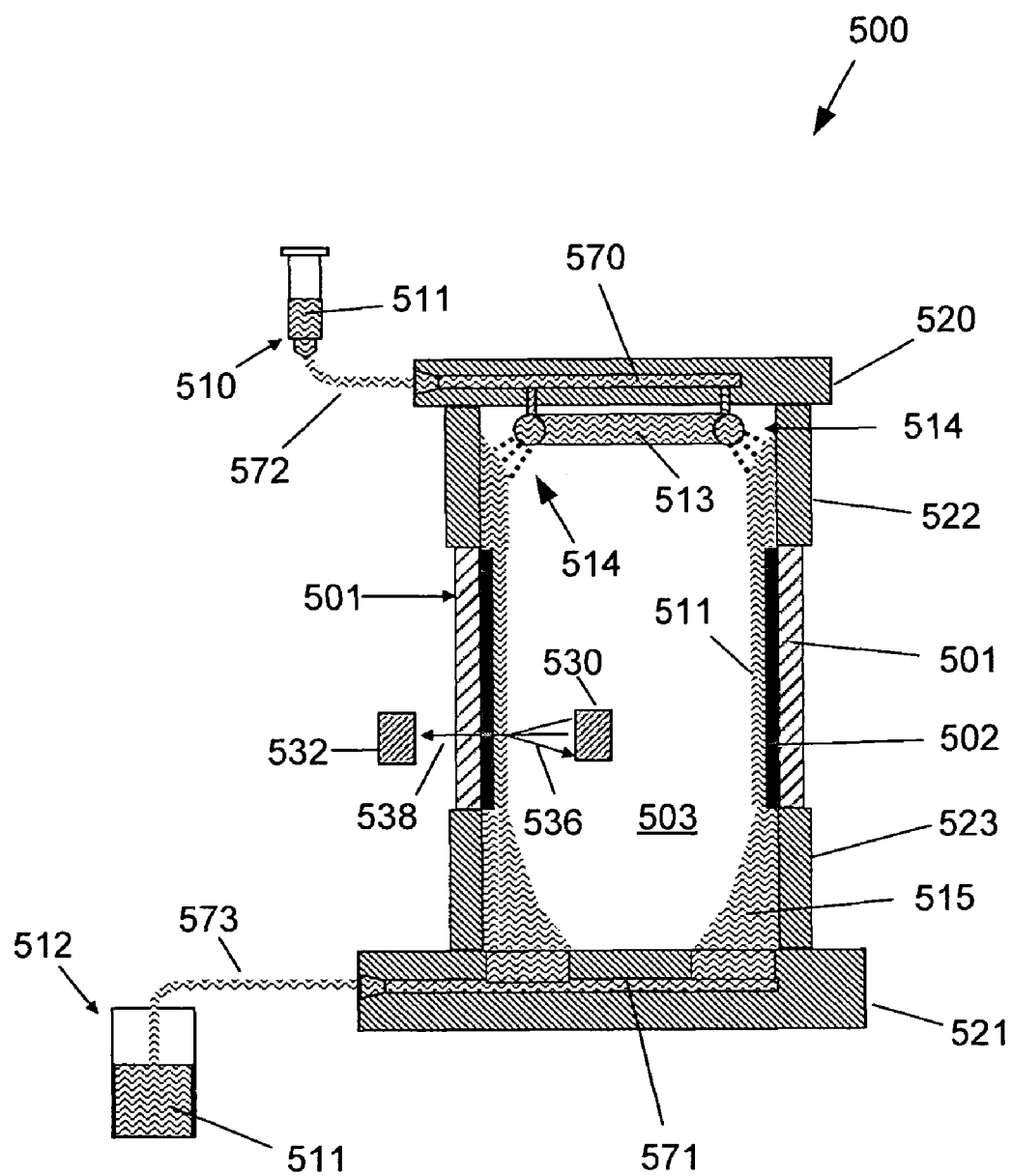
FIG. 5 is a schematic drawing depicting a cross section of a further embodiment for the application of a photoresist developer to an internal surface of a support cylinder.

For processes based on exposure of a photoresist, one or more subsequent development steps may be included for the formation of the desired three-dimensional relief pattern, as shown in FIG. 5. For example a Shipley type photoresist commonly used in the semiconductor industry uses an aqueous basic developer to dissolve those areas exposed to the writing beam or photomask pattern.

FIG. 5 is a schematic drawing, in accordance with a further embodiment, depicting a cross section of a fluid delivery apparatus 500 that may be used for the application of a photoresist developer to an internal surface of a support cylinder 501 with substrate 502 in accordance with a further embodiment similar to apparatus 200 of FIG. 2. It should be noted that an analogous process to that shown in FIG. 5 can be used to develop the external surface of a cylinder.

The apparatus 500 can include first and seconds ends 520, 521 for holding the support cylinder 501. The first end 520*a* includes a first passageway 570 that is configured to receive a fluid 511 from a fluid supply 510 (possibly via external piping or passageways 572) and to distribute the a fluid 511 for application to a substrate layer 502 disposed on a selected surface (e.g., the inner surface) of the support cylinder 501. A manifold 513 may be configured within the bore 503 of the cylinder 501 for receiving fluid 511 from the first end 520. Manifold 513 includes one or more orifices suitable for the distribution (shown as fluid spray 514) of the fluid 511 to a selected surface (e.g., the inner surface) of the support cylinder 501. The apparatus 500 can include a second end 521 for holding the support cylinder 501 at a different location than the first end 520. The second end 521 may include a second passageway 571 that is configured to receive accumulated fluid 515 from the support cylinder 501. Once removed from the cylinder 501, fluid 511 may be directed to a desired location, e.g., a suitable reservoir 512, via suitable external piping or passageways 573.

Also shown in FIG. 5 are a pair of cylindrical wall 522, 523 that act as holding means for holding the support cylinder 501 relative to the first and second ends 520, 521. The pair of cylindrical walls 522, 523 can be disposed substantially along the same cylindrical surface, each one of the pair located at opposite ends of the support cylinder 501, with each wall having a lateral surface adapted to receive the support cylinder 501. Other suitable holding means may be used for support of the support cylinder, e.g., gasket configurations, etc.

As shown in FIG. 5, the development process of a photoresist applied to the support cylinder 501 may be monitored optically. The optical monitoring may be performed in real time by using a suitable optical source 530 and detector(s) 532 to detect the reflection 536 or transmission 538 of radiation produced by the source 530. The developer liquid may be removed or application of such may be stopped when it is determined that the optimum endpoint of the development process has been reached. Suitable control and detection circuitry (not shown) may be used for such monitoring. In exemplary transmission embodiments, sleeve 501 may be transparent to the applied radiation of source 530.

It should be noted that developed patterns, e.g., a desired relief pattern produced by application of developer according to FIG. 5, may further be made more resistant to mechanical and chemical attack or degradation by use of radiation and/or chemical processing, e.g., by general hardening processes know, in the art. For example, exposure of development photoresist to e-beam, UV, or thermal radiation in a post-processing operation can increase the durability, abrasion resistance, solvent resistance, etc., of the photoresist ("hardening"). In the case of certain photoresists, e-beam exposure is particularly effective. Such hardening of the patterned photoresist can allow a patterned cylinder to be used and re-used for subsequent tool formation ("replication"). Certain image processes, such as ablation, dye-polymer, etc., do not require a subsequent process to form ("develop") the three-dimensional relief pattern resulting from the previously described image processes. In certain embodiments, hardened externally-patterned cylinders may be used directly in manufacturing, although the durability may generally not be as good as that of other patterning tools (discussed below).

For the production of a desired pattern in/on a surface of a support cylinder used for forming a replication tool, patterning techniques described herein may additionally make use of precise positioning of the patterning apparatus (laser or e-beam, photomask, image field, embossing tool, etc.) with respect to the substrate or selected surface of the support cylinder. Achieving precision alignment may be facilitated by use of mechanical hardware appropriate for resolution of the desired pattern, with consideration of the mechanical limitations of the system.

Certain embodiments including those using beams of radiation for writing/recording the desired pattern have additional advantages of being steerable (laser, e-beam) to make small adjustments for more accurately aligning the patterns. In addition to using mechanical hardware appropriate for the resolution of the desired pattern, other techniques can be used to assist in the pattern alignment process, such as interferometry. For example, a desired pattern may be embedded (or pre-written) in the substrate or written directly onto the substrate (by ablation or other techniques that result in an immediately readable pattern.) Optical techniques (e.g., distance or interference fringe measurement, etc.) can be used to correct the position as the patterning device aligns or "stitches" a new pattern with a previous one.

Once the selected surface of a support cylinder has a desired or predetermined relief pattern, the support cylinder may be used to form a complimentary replica or negative-relief pattern in a durable cylindrical surface of a tool that is suitable for use in preformatting desired media, e.g. optical discs. This replication of the original relief pattern can be accomplished by a number of techniques, including electroless plating, electrolytic plating, electroforming, physical vapor deposition, chemical vapor deposition, epoxy replication, radiation cross-linking, casting, etc. In exemplary embodiments, durable replicas may be created by means of an electrodeposition process, such as nickel electroforming.

Figure 6:
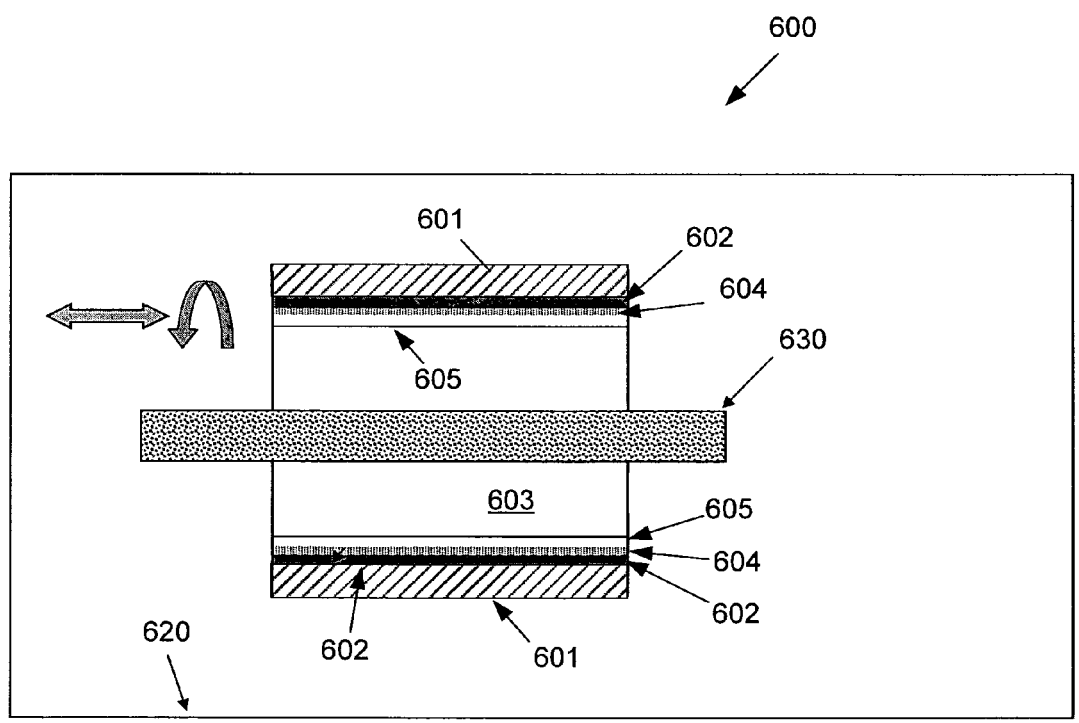
FIG. 6 is a schematic drawing depicting a cross section of a further embodiment for vacuum deposition of a layer on an internal patterned surface of a support cylinder.

FIG. 6 is a schematic drawing depicting a cross section of an apparatus 600 for vacuum deposition of a layer on an internal patterned substrate surface of a support cylinder 601, in accordance with a further embodiment. The substrate 602 with portion that includes a desired relief pattern 604 is disposed on a selected surface, e.g., inner, of support cylinder 601. The apparatus 600 includes a vacuum chamber 620 in which a support cylinder 601 is placed. A sputtering cathode or evaporation wire 630 may be positioned through the bore 603 formed by the support cylinder 601. The configuration of the evaporation wire 630 and support cylinder 601 facilitates uniform coating of the inner surface of the cylinder 601 with a desired material.

In the case of the internally-patterned cylinder 601 with substrate 602 having a portion 604 containing the desired pattern, the sputtering cathode or wire 630 running in the direction of the cylinder axis can be used to vacuum deposit a conductive ("starting") layer 605, such as Ni, NiV, or Ag, etc. Such a conductive or starting layer 605 may be useful for eletroforming/plating embodiments (e.g., shown and described for FIGS. 7A-7B) to initiate plating of a non-conductive patterned surface. In order to improve the uniformity of the deposition, the source/cathode and/or the cylinder 601 can be rotated and/or translated during the starting layer deposition process. The thickness of the layer 605 may be selected as desired, e.g., to be sufficient to form a continuous conductive layer on the pattern (typically less than 100 nm).

Metal plating (e.g., electroforming) or electroless deposition may be used to produce durable replication tools in accordance with certain embodiments of the disclosure. In exemplary embodiments, a metal deposition cell such as shown and described for FIGS. 7A-7B may be used for the formation of replication tools.

Figure 7A:
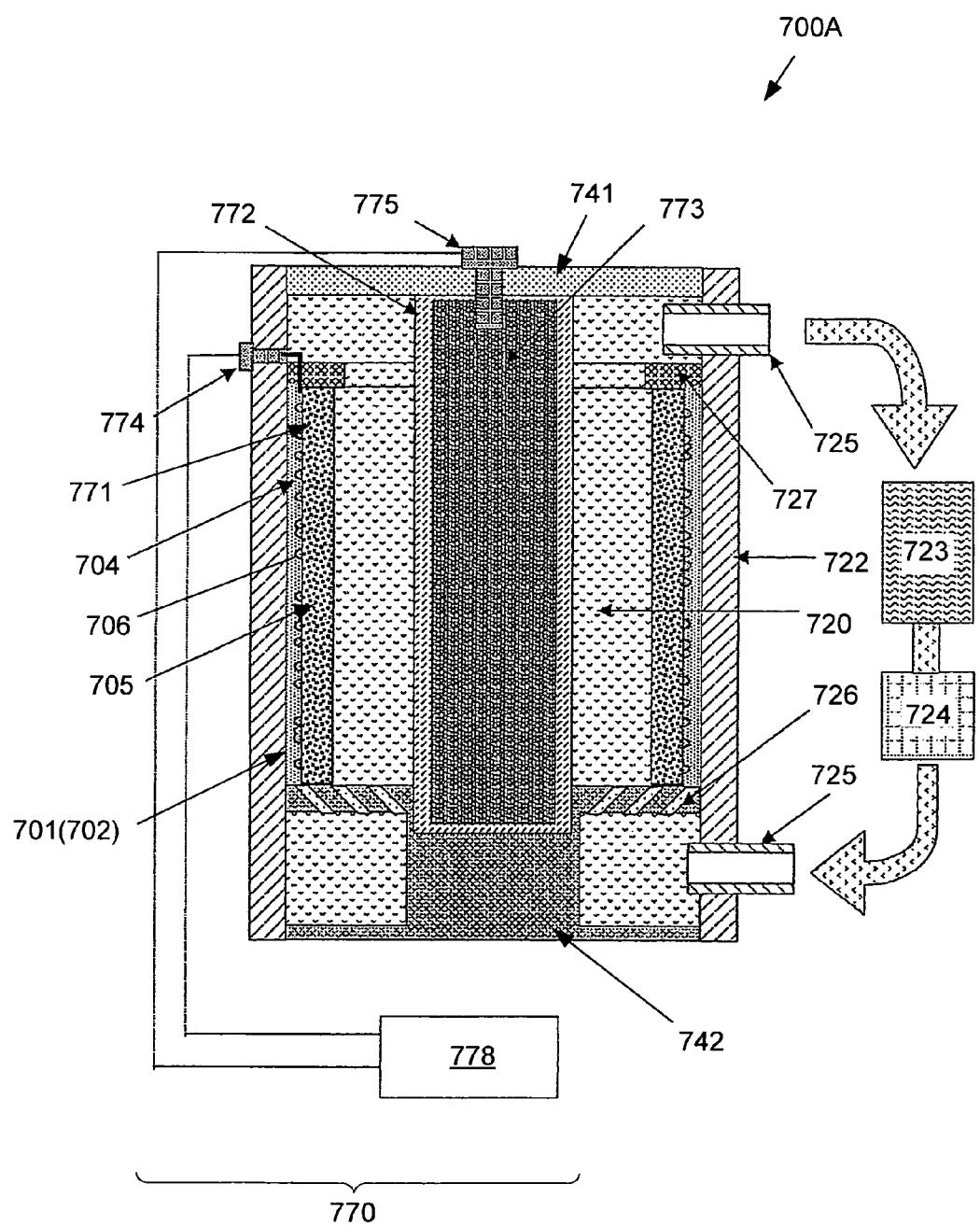
FIG. 7A is a schematic drawing depicting a cross section of a further embodiment in which an electrochemical deposition cell is utilized for making durable pattern replication tools having a negative-relief replica of a pattern formed on an inner surface of a support cylinder.

FIG. 7A is a schematic drawing depicting a cross section of an electrochemical deposition cell 700A for making a durable pattern replication tools having a negative-relief replica of a pattern formed on an inner surface of a support cylinder 701, in accordance with further embodiments. As shown, a support cylinder 701 is placed within the deposition cell 700A An outer cylinder 722 of the cell 700A may be sized and adapted to securely hold the support cylinder 701 having a relief patter on its inner surface, such as described previously for FIGS. 1 and 2. First and second end disks 741, 742 may be present to seal cylinder 722 to circulate a metal-containing solution suitable for electrochemical or electroless plating. The deposition system 700 may be used to make a durable sleeve with an inverse or negative of the relief pattern on the inner surface of a support cylinder. The resulting durable sleeve may be used for as part of a replication tool, as described herein. A metal containing solution, e.g., aqueous, is circulated within the cell 700A. In the case of electroforming, an electrolyte, e.g., aqueous nickel sulfamate solution, is circulated between anode and cathode surfaces, and a voltage is applied between the two surfaces. This applied voltage results in the deposition of nickel (Ni) metal onto the patterned surface, where the total deposit thickness is determined by the amount of current passed during the deposition process. The details of the electroforming process are well known in the art. In other embodiments of the metal replica formation process, a Ni (or other conductive) layer is deposited by means of electroless deposition, a widely used process in which metals are formed by reduction onto a catalytic or nucleation layer (e.g., silver mirror formation) on the surface to be replicated. Several key variables, including time and temperature, are used to control the thickness of the deposit, which can, for example, range from microns to millimeters, as desired. The details of the electroless deposition process are known in the art.

With continued reference to FIG. 7A, system 700A may include a closed recirculating system including a reservoir 723 from which a metal-containing solution 720 is pumped, an in-line filtration system or filter 724 to remove any particulate and other unwanted matter, and heating elements (not shown) by which the reservoir 723 is caused to reach and maintain a desired operating temperature. The system 700A may include suitable pumping and valving means to allow the metal-containing solution to continuously circulate under controlled (and monitored) conditions. Suitable pumping and valving means can include but are not limited to suitable pumps, pipes, valve, and related components.

The metal-containing solution 720 circulates through cylinder 722 as part of a plating process. The solution may be heated in reservoir 723 and passed through filtration unit 724 before entering the cell at location 725. The support cylinder 701 with photoresist substrate 702 may initially serve as a part (e.g., a boundary wall) of the deposition and fluid recirculation pathway. In exemplary embodiments, the solution 720 exits the cell at the top outflow pipe 721 and returns to reservoir 723 for reconditioning and recirculation to the cell. One or more non-conductive stop rings 727 may be located on the substrate, e.g., toward one end of the cell, to facilitate definition of the ends of the deposited replica by inhibiting the deposition process at this surface.

A spiral distribution flow director 726 may, as shown, optionally be present at the bottom of the cell to create a fluid vortex pattern within the cell 700A to facilitate a higher flow velocity near the cylinder wall. Such a flow improvement may facilitate thorough mixing of the solution, as well as dislodging and sweeping away of bubbles or other byproducts or impurities from the inside walls of the cylinder 722.

Also shown in FIG. 7A is an optional electrical circuit 770 for use in exemplary electroplating embodiments. The electrical circuit 770 can provide sufficient current paths for electrodeposition of a sleeve layer 705 onto the patterned substrate or layer 702 or patterned support cylinder 701 containing the first relief pattern. The electrical circuit 770 can include two electrodes 771, 772 for applying a current through the metal containing solution 720. The inner surface of the pattern-containing support cylinder 701 may be coated with a thin layer or coating of electrically conductive material (not shown) forming the first electrode for initiation of electroplating. The thin conductive coating can be achieved by suitable techniques such as vacuum deposition, e.g., as shown and described previously for FIG. 6, or electroless deposition. The first electrode can be connected via terminal 774 and appropriate electrical connection(s) to power supply 728. The second electrode 772, e.g., as a nickel assembly, may be positioned within cylinder 722 and may be connected through a terminal 772 and suitable electrical connection(s) to power supply 778. Circulation of the electrolyte 720 within the cylinder 722 provides an electrical path between the electrodes and the power supply and completes the electrical circuit 770. In exemplary embodiments, the second electrode 772 includes Ni pellets (or solid rod or the like) placed a titanium basket, which in turn is surrounded by a filter bag to retain any particulates produced as byproducts of the electroforming process.

To electroplate the inner surface of the support cylinder 701 and thereby form a durable sleeve including a replica relief pattern, current passes through the electrolyte solution between the electrodes. In accordance with Faraday's Law, the thickness of the deposited metal (e.g., nickel) layer 705 is proportional to the total charge passed through the cell, as is known in the art of electroplating. The process can be terminated after any length of time, where the thickness of the deposited layer is thereby proportional to the cumulative amount of current passed through the cell, as well as other factors, and which typically may range from a few microns to many millimeters in thickness. When the thickness of the deposit has reached the desired value, such as 0.010 inches for one example, the electrodeposition process may be terminated by removing the voltage, draining and disassembling the cell 700A.

Figure 7B:
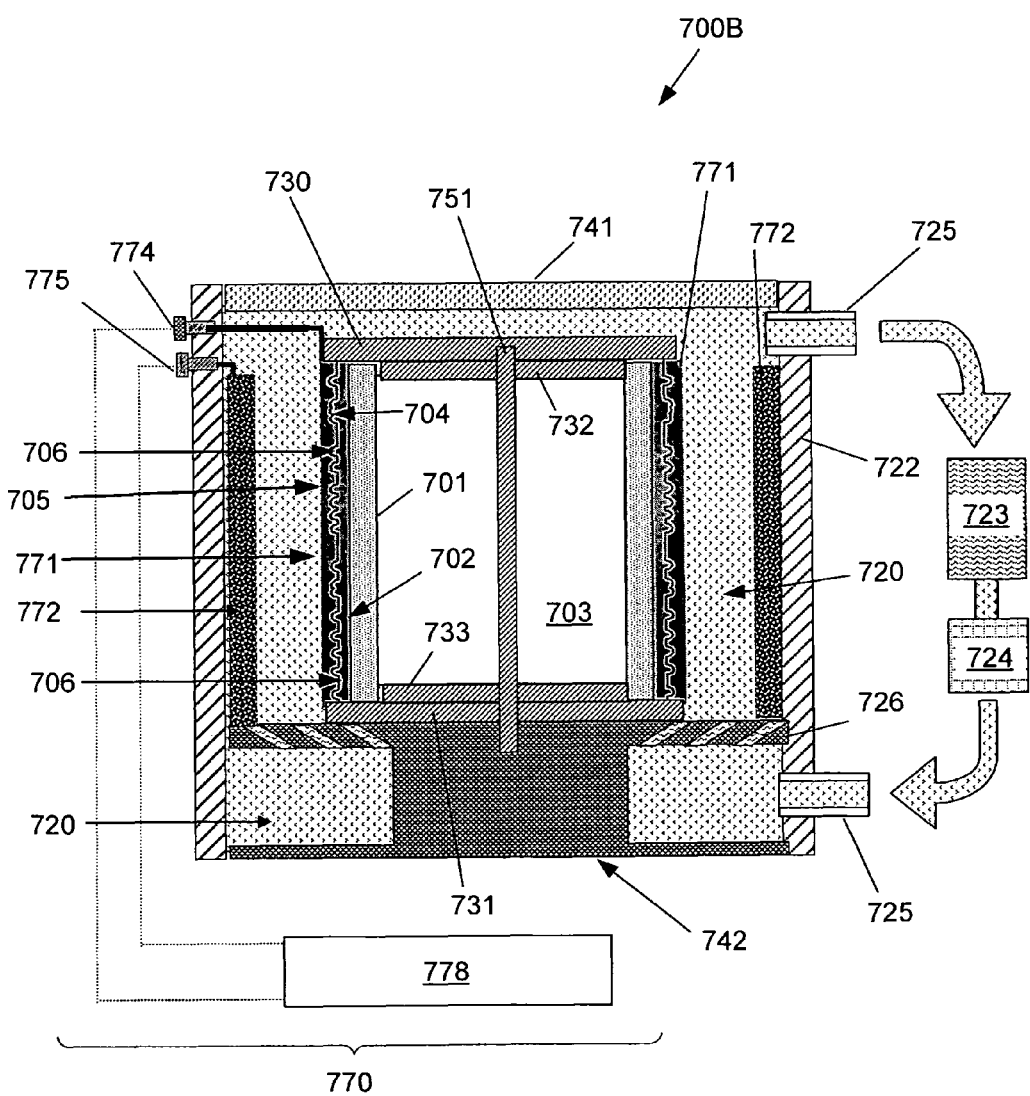
FIG. 7B is a schematic drawing depicting a cross section of an electrochemical deposition cell similar to that of FIG. 7A for making durable pattern replication tools having a negative-relief replica of a pattern formed on an external surface of a support cylinder, in accordance with a further embodiment.

FIG. 7B is a schematic drawing depicting a cross section of an electrochemical deposition cell 700B, similar to (and including like numbering) deposition cell 700A of FIG. 7A. Cell 700B can be used for making durable pattern replication tools with relief patterns 704 recorded on an external surface of a support cylinder 701, in accordance with further embodiments of the present disclosure.

The cylinder 701 includes a desired first relief pattern 704 in a substrate 702 disposed on an outer surface of the cylinder 701. For the embodiment shown, the externally patterned support cylinder 701 is located between a first pair of end plate 730, 731, which can serve to prevent solution 720 from entering the cylinder. A second pair of end plates 732, 733 and a centralizing shaft 751 may also be present to facilitate positioning of the cylinder.

In addition to electroplating and deposition techniques such as those shown and described for FIGS. 7A-B, a replica of a patterned cylinder can be formed by suitable techniques including casting techniques. FIGS. 8A-D (with like numbering) depict apparatus 800A-D that are suited for casting a polymeric material against the patterned surface to form a tool sleeve for use in replication tools according to exemplary embodiments of the present disclosure.

Figure 8A:
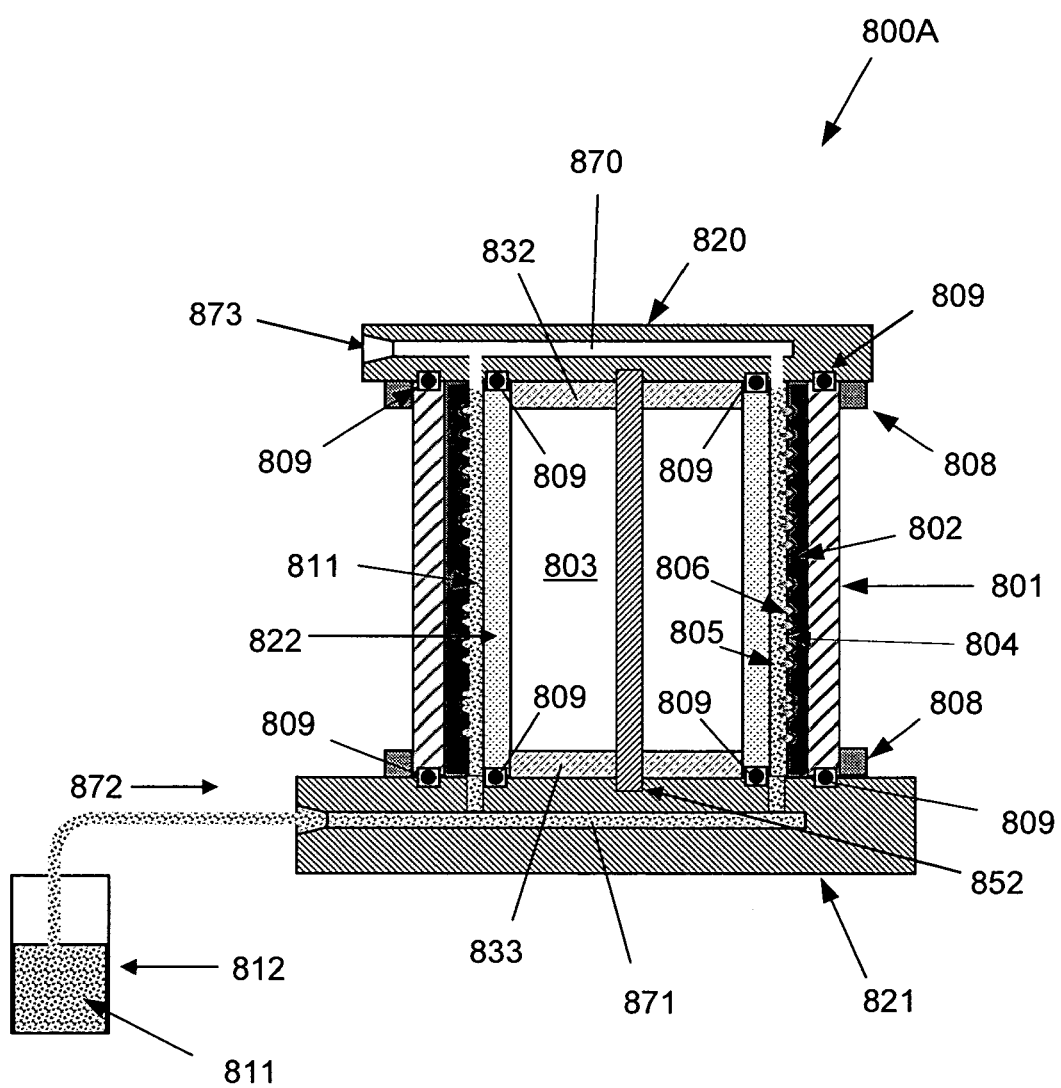
FIG. 8A is a schematic drawing depicting a cross section of a further embodiment for applying a liquid such as polymer to an internal patterned surface of the support cylinder.

FIG. 8A is a schematic drawing depicting a cross section of an apparatus 800A useful for applying a fluid or liquid such as polymer to an internal patterned surface of a support cylinder 801, in accordance with a further embodiment. For the embodiment shown, a desired relief pattern 804 is located within a substrate 802 disposed on an inner surface of the support cylinder or sleeve 801. The apparatus 800A, or fixture, can include first and seconds ends 820, 821 for holding the support cylinder 801 and a cylindrical shell or sleeve 821. The cylindrical sleeve 821 may function as holing means for holding the support cylinder relative to the first and second ends 820, 821. The first and second end 820, 821, along with the support cylinder 801 and cylindrical sleeve 821 may be configured and arranged in a fluid-tight seal. In such a configuration, a cylindrical fluid passageway is formed through which a desired fluid 811, such as a curable liquid polymer, can be applied to a patterned surface of the support cylinder 801 for forming a replication tool having the complimentary relief pattern.

The first end 820 of the apparatus 800A can include a first passageway 870. The first passageway may be configured to receive vacuum from a vacuum supply (shown as 873). and to apply the vacuum to a castable fluid 811 such as a polymeric liquid to draw the fluid 811 over a patterned surface of a support cylinder 801. The apparatus 800A can include a second end 821 for holding the support cylinder 801 at an opposite end of the support cylinder than the first end 820. Alignment rings 808 and seals 809 may be used for alignment and sealing of the support cylinder 801 and cylindrical sleeve 82s. In exemplary embodiments, alignment plates 832, 833 in conjunction with a centralizing shaft 852 may be used for alignment of the support cylinder and cylindrical sleeve 822.

With continued reference to FIG. 8, through application of vacuum to the fluid 811, the fluid 811 is caused to flow through the second end 821 and over the patterned surface, e.g., substrate 802 with first desired relief pattern 804. By a casting process, a sleeve layer 805 including a second desired relief pattern 806 complementary to the first relief pattern 804 can be formed.

As used for embodiments in accordance with FIGS. 8A-8D, suitable polymeric materials can include, but are not limited to, a radiation cross-linkable polymer system, such as a material that is curable by application of ultraviolet light. Other suitable materials include, but are not limited to, thermoplastics, which may be injected in the molten state and allowed to cool, or multi-part catalytically/thermally cured materials ("epoxies") and the like.

Figure 8B:
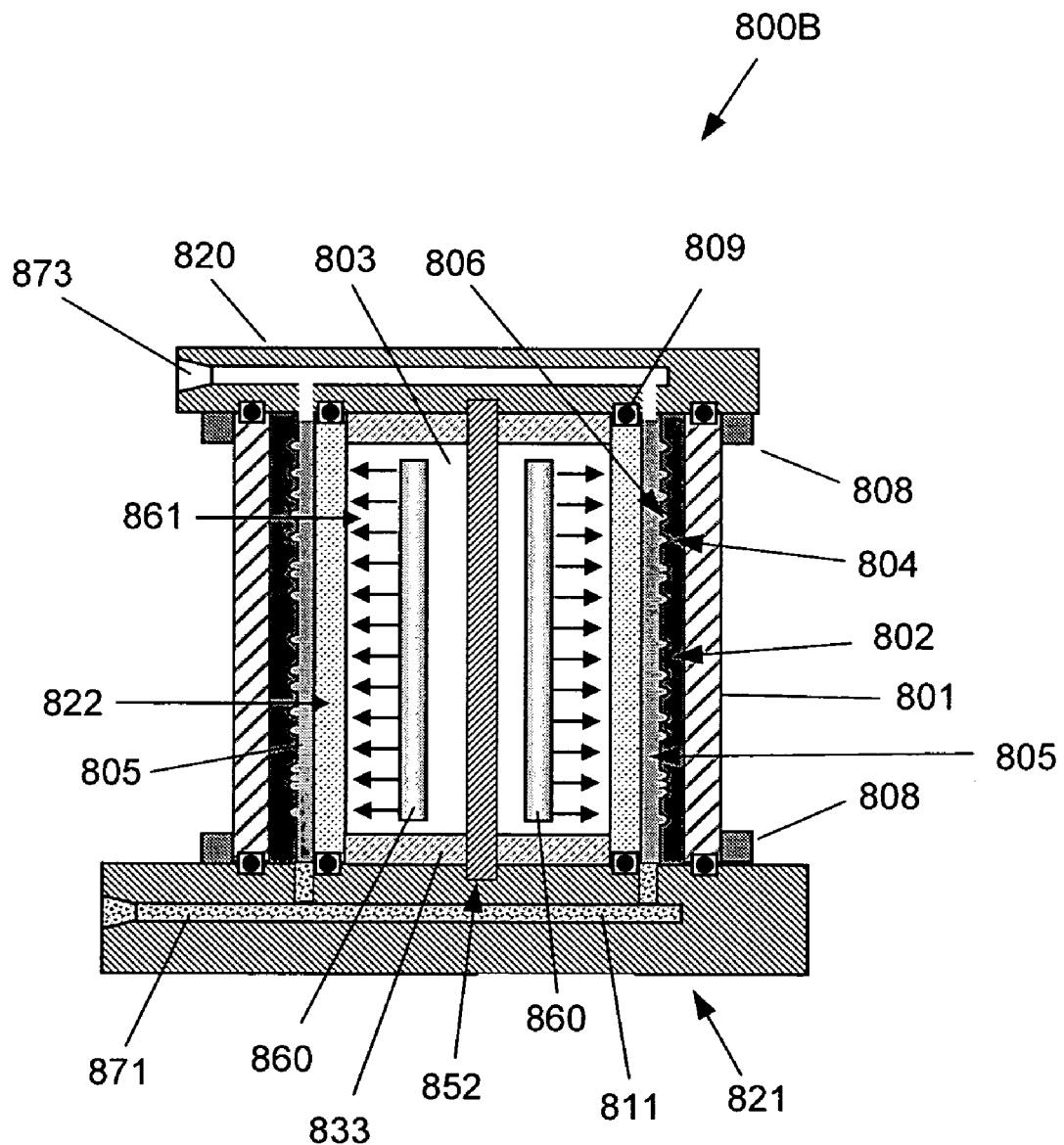
FIG. 8B is a schematic drawing depicting a cross section of a further embodiment for curing a layer such as a polymer applied to an internal patterned surface of the support cylinder, for example as shown in FIG. 8A.

FIG. 8B depicts an apparatus 800B that is similar to 800A except for the inclusion of one or more radiation sources 860 configured within the cylindrical sleeve or shell 822 to cure a radiation-curable liquid 811. For the embodiment shown, the cylindrical shell 822 is transparent or translucent to the radiation of the source(s) 860. The radiation source operates to irradiate the curable polymer 811. When the curable liquid polymer 811 is cured and hardened it forms a tool sleeve 805 having a complimentary (second) relief pattern to the relief (first) pattern 804 recorded in the substrate 802 on the support cylinder 801. According to an exemplary embodiments UV-curable polymers are utilized for the layer 805.

It may be desirable to minimize the amount of polymer adhering to the second pattern 806 after separation of the durable layer or sleeve 805 from the support cylinder 801. The use of polymer/pattern combinations with low intrinsic adhesion to one another, or the use of a "parting" layer can facilitate a minimum amount of adhering polymer or eliminate such altogether. For example, a parting layer could be coated on the master pattern surface and would adhere preferentially to one of the two surfaces. Such a parting layer could be either left in place or removed, e.g., by chemical or plasma stripping, etc.

Figure 8C:
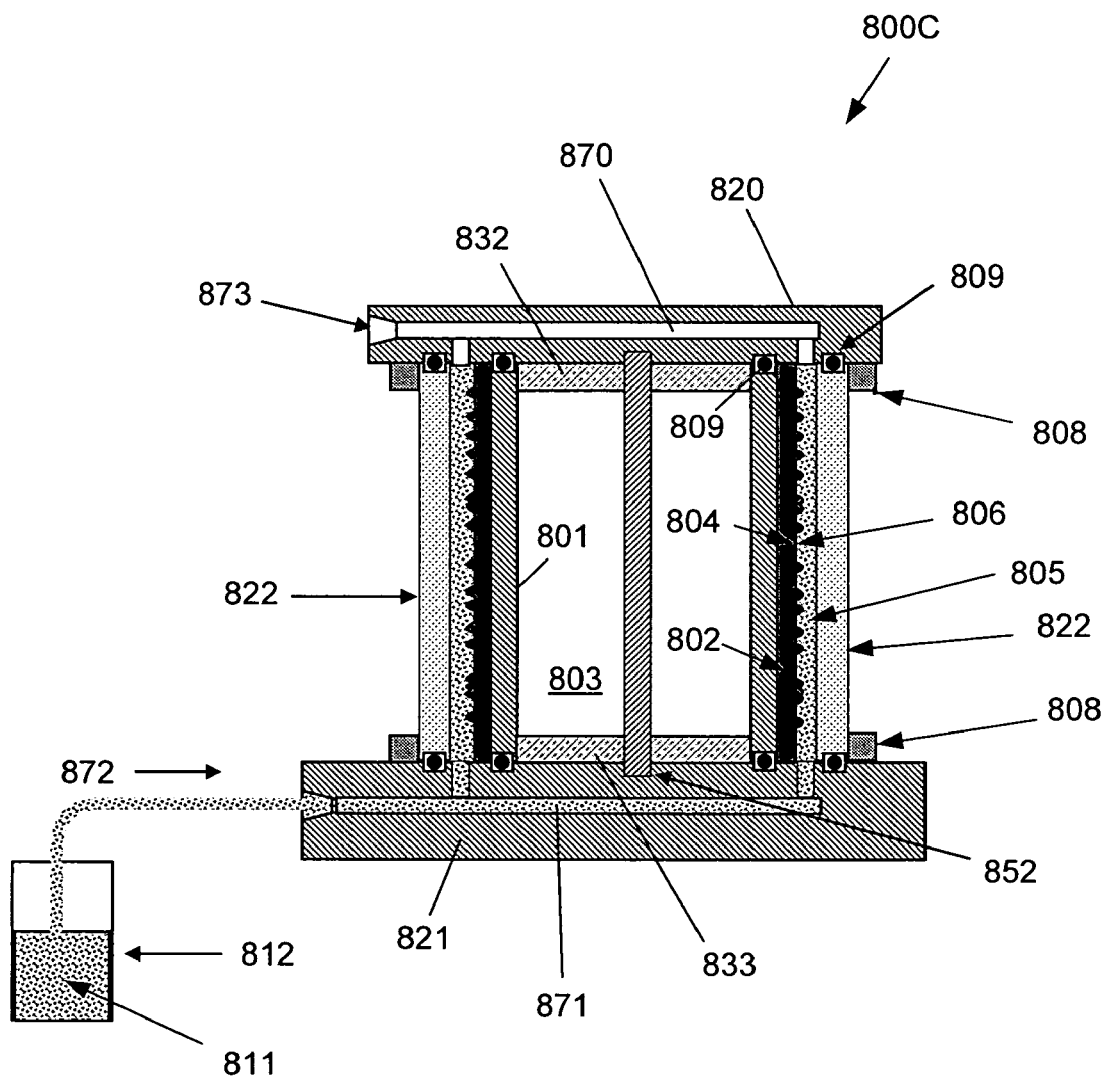
FIG. 8C is a schematic drawing depicting a cross section of a further embodiment according to an embodiment for applying a liquid such as a polymer to an external patterned surface of a support cylinder.

FIG. 8C is a schematic drawing depicting a cross section of an apparatus 800C, similar to 800A of FIG. 8A, but configured and arranged for forming a tool sleeve is formed about an external surface (i.e., in a radial sense) of a support cylinder 801. Embodiments such as 800C may be used for applying a fluid (e.g., liquid or gas) such as a curable liquid polymer to an external surface of a support cylinder.

Figure 8D:
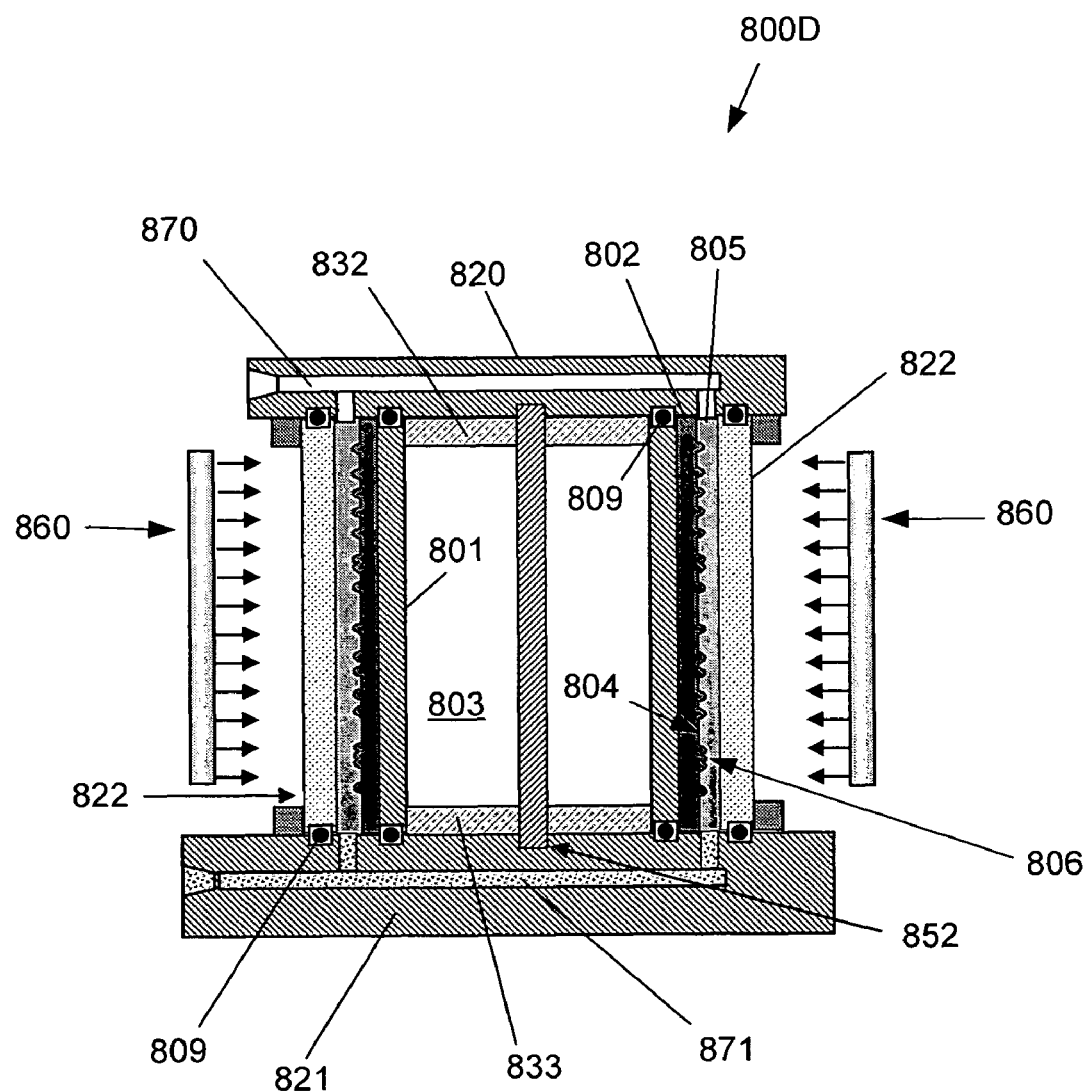
FIG. 8D is a schematic drawing depicting a cross section of a further embodiment for curing a layer such as a polymer applied to an external patterned surface of the support cylinder, for example as shown in FIG. 8C.

FIG. 8D depicts an apparatus 800D that is similar to 800B except that the one or more radiation sources 860 are configured on the exterior of the cylindrical shell 822, which itself is configured on the exterior of the support cylinder 801. Apparatus 800D may be used for curing a layer such as a polymer that has been applied to an external surface of the support cylinder 801, in accordance with exemplary embodiments. For the embodiment shown, the cylindrical shell 822 is transparent or translucent to the radiation of the source(s) 860. In certain embodiments, the initial or master three-dimensional relief pattern may itself be sacrificed or removed (or partially removed) as part of the process to separate the support cylinder from a final tool sleeve.

Figure 9A:
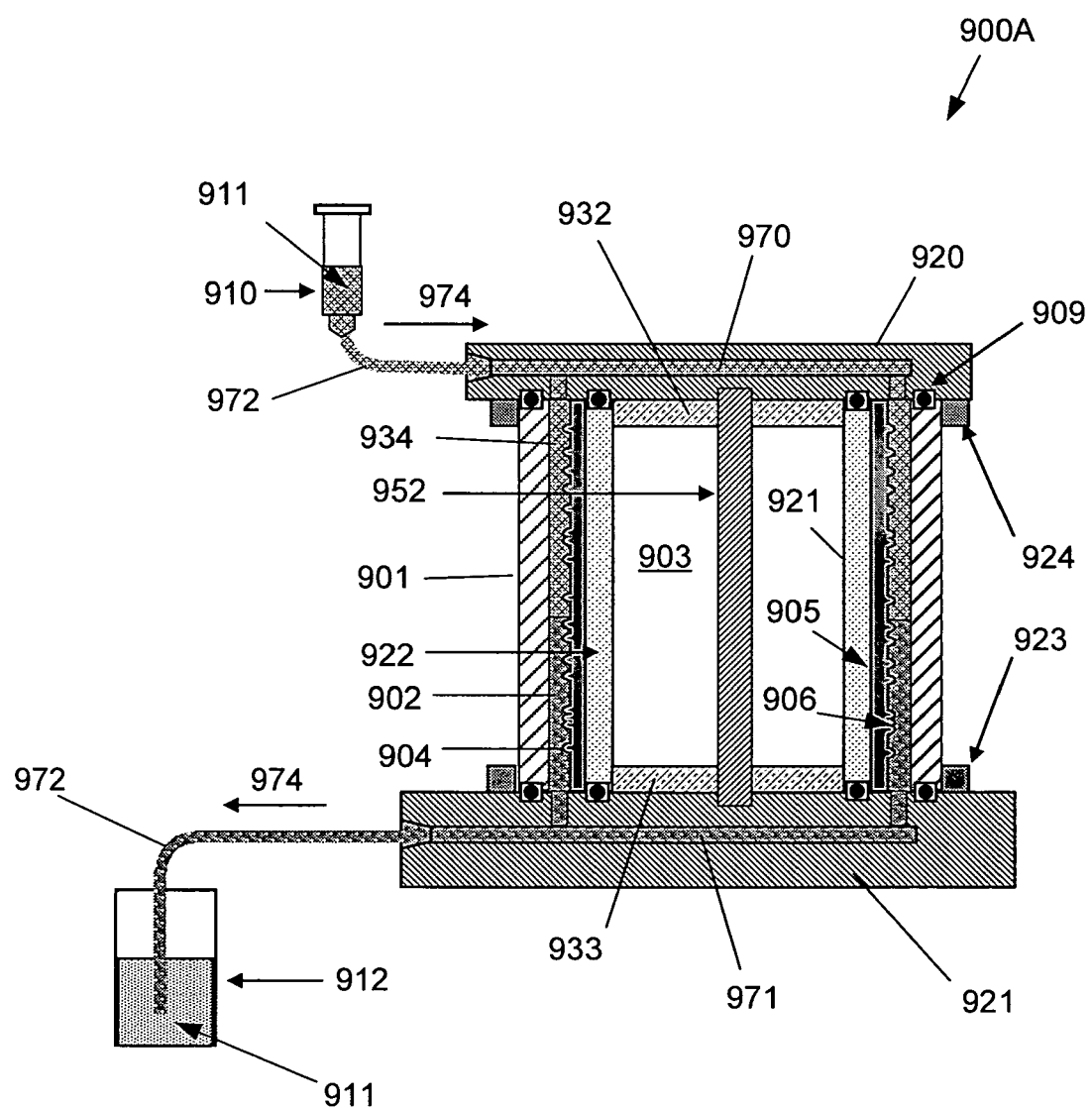
FIG. 9A is a schematic drawing depicting a cross section of a further embodiment used for chemically stripping a photoresist layer applied to an internal surface of a support cylinder.

FIG. 9A is a schematic drawing depicting a cross section of an apparatus 900A used for chemically stripping a material layer (e.g., photoresist) applied to an internal surface of a support cylinder 901, in accordance with a further embodiment. The apparatus 900A, similar to apparatus 200 of FIG. 2, can include first and seconds ends 920, 921 for holding the support cylinder 901 with substrate 902 and first relief pattern 904. A chemical that acts as a solvent for the master layer material of the substrate 902, but not the replica 905, may be introduced into the interface, e.g., 934. between the master (substrate 902) and replica sleeve 905, thereby dissolving master material and producing a gap between the two surfaces.

The first end 920 includes a first passageway 970 that is configured to receive a fluid 911, e.g., a photoresist solvent, from a fluid supply 910 (possibly via external piping or passageways 972) and to distribute the a fluid 911 for application to a substrate layer 902 disposed on a selected surface (e.g., the inner surface) of the support cylinder 901. The second end 921 may include a second passageway 971 that is configured to receive the fluid 911, e.g., from within bore 903, for removal from the selected surface of the support cylinder 901. Once removed from the cylinder 901, fluid 911 may be directed to a desired location, e.g., a suitable reservoir 912. The direction of flow 974 is indicated for the configuration shown. Alignment rings 923, 924 may be used to facilitate precise positioning of the support cylinder 901 relative to the first and second ends 920, 921 in exemplary embodiments.

A precision centralizing shaft 952 and precision bearing surface along which the inner or outer element is guided may be used in order to eliminate or minimize contact of the two surfaces during separation as shown in FIG. 9A. A cylindrical sleeve or bearing surface 922 is placed into contact with the tool sleeve 905 with relief pattern 906, e.g., as made by system 600 of FIG. 6A. Centralizing disks, or elements, 932, 933 are positioned at opposing ends of the tool sleeve 905. Bearing surface 922 and element 932, 933 operate as a centering means or device that centers sleeve 905 about shaft 952, and thereby prevents damage to the outer pattern of the replica sleeve during the process of separation of replica tool sleeve 905 from cylinder 901. In exemplary embodiments, one or more seals 909 may be used to facilitate fluid tight sealing between bearing surface 922, cylinder 901 and the ends 920, 921. The bearing surface 922 may, in exemplary embodiments, be an expandable arbor, e.g., an inflatable elastomeric device, or a mechanical expansion device, etc. By centering the sleeve 905 and the support cylinder about the same central axis and then separating the sleeve 905 and cylinder 901 apart along the axis of the shaft 952, damage to the relief pattern 906 on the sleeve 905 surface can be prevented or minimized for the separation process, e.g., as shown in FIG. 9B.

Figure 9B:
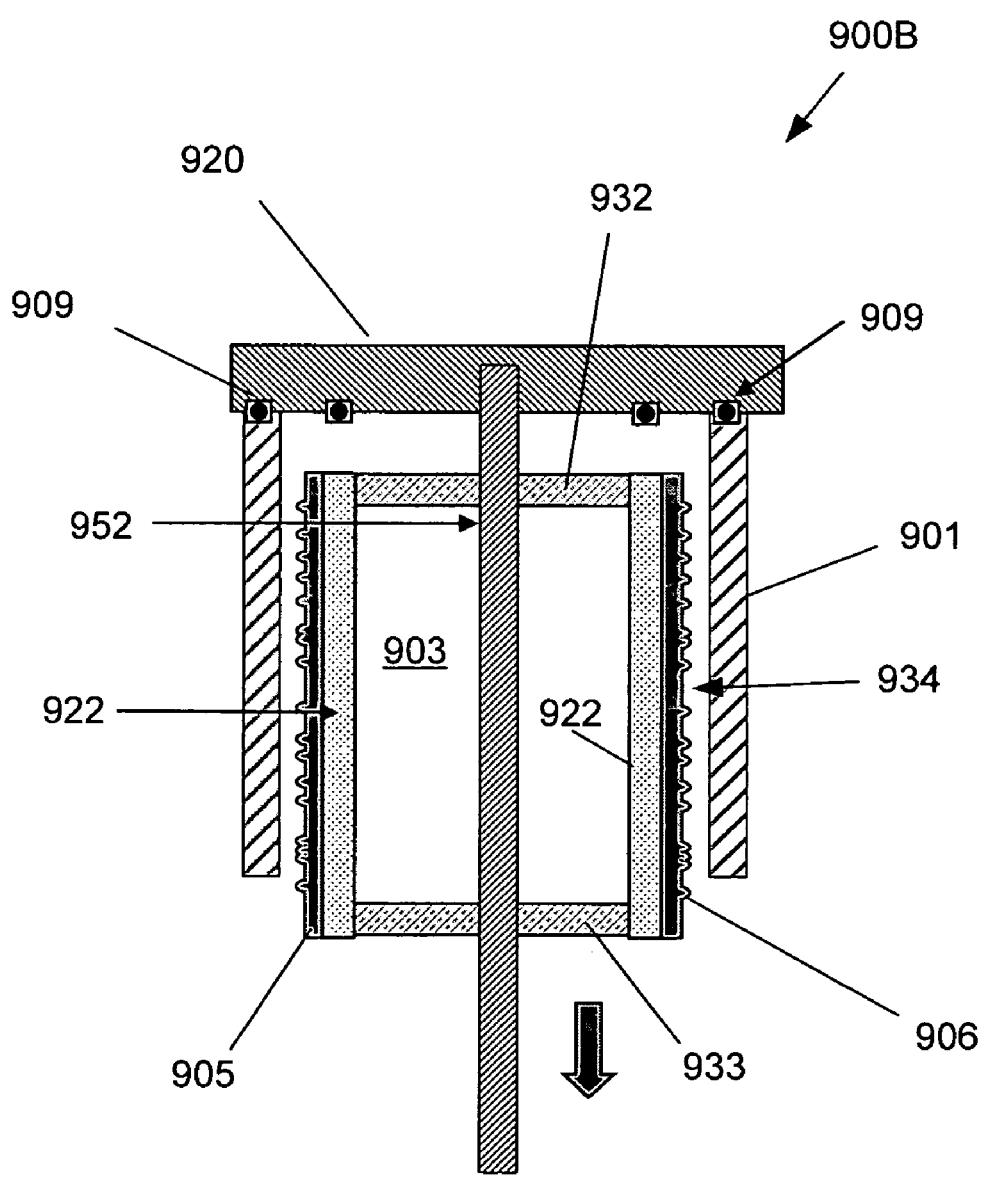
FIG. 9B is a schematic drawing depicting a cross section of a further embodiment used in the removal for of a replication tool sleeve from a support sleeve or patterning fixture.

FIG. 9B is a schematic drawing depicting a cross section of portions of FIG. 900A in a removal process for of a replication tool sleeve from a support sleeve or patterning fixture in accordance with another embodiment 900B. After the solution (911 of FIG. 9A) has penetrated and dissolved the photoresist, the tool sleeve 905 may be separated by means of sliding assembly of the bearing surface 922 and elements 932, 932 on shaft 952.

To further assist separation, e.g., as shown in FIG. 9B, the dissolved material can be used as a "lubricant" layer, or alternatively another material designed to lubricate/protect the replica surface can be introduced into the interspace for the separation process. In certain embodiments, a planarizing layer can be first applied to the SCS to increase separation clearance prior to coating of the photoresist layer. Residual photoresist or other contaminant material can be removed from the external patterned surface of the tool by cleaning as necessary.

Figures 10A, 10B:
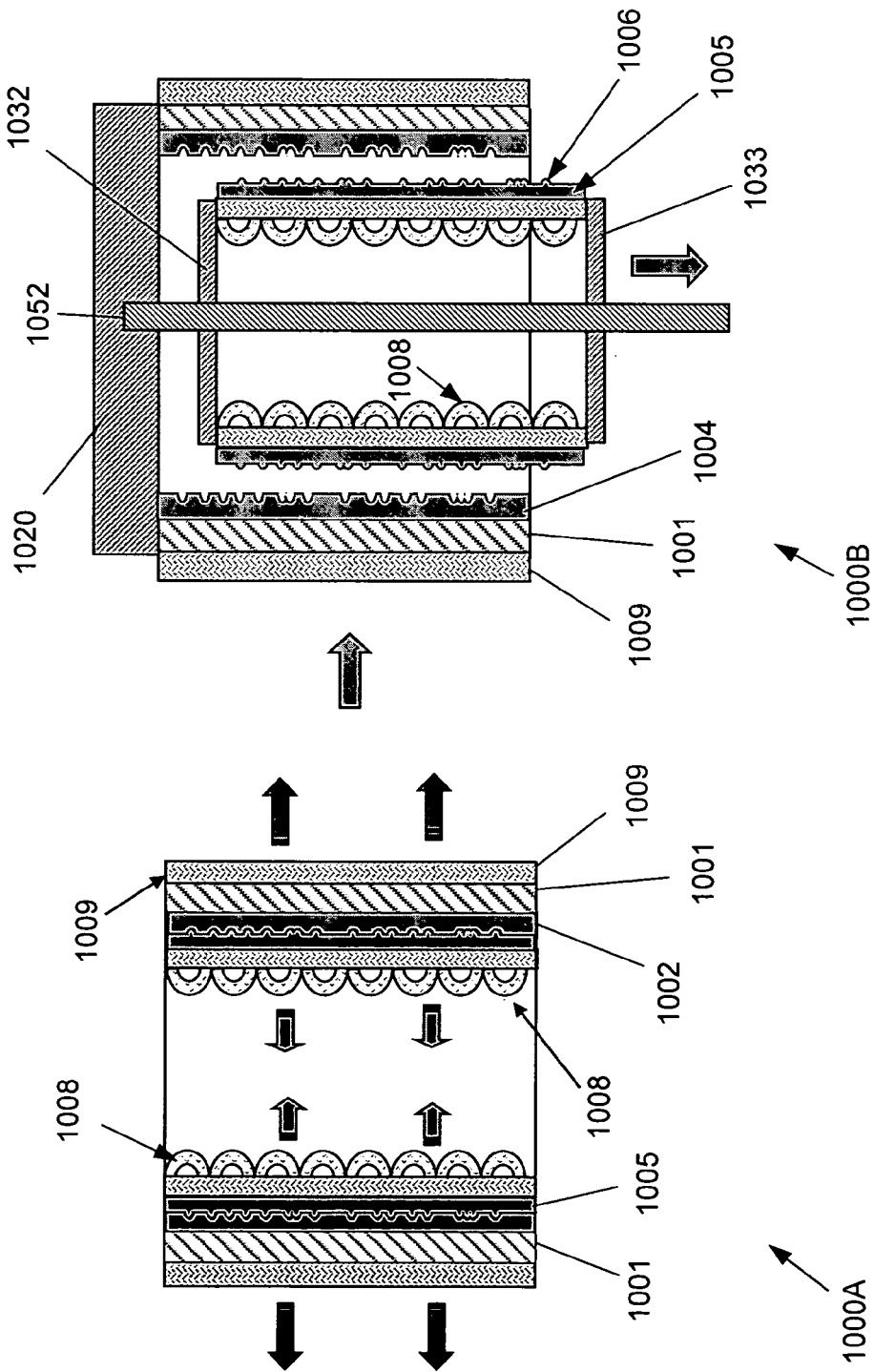
FIG. 10A is a schematic drawing depicting a cross section of a further embodiment for separating an internal replica from a patterning fixture by differential thermal expansion/contraction.
FIG. 10B is a schematic drawing depicting apparatus of FIG. 10A with the internal replica mounted on a centralizing fixture and partially separated from the outer fixture.

Separating the replication tool sleeve 905 from the support cylinder 901 may include other techniques such as those relying on differential thermal expansion/contraction between the support cylinder and replication tool sleeve, for example as described for FIGS. 10A-10B.

FIGS. 10A-10B are schematic drawings depicting cross sections of a further embodiments 1000A-B that utilize application of a heat flux for separating an internal replica 1005 with relief pattern 1006 from a patterning fixture with support cylinder 1001 having substrate 1002 and relief pattern 1004.

FIG. 10A is a schematic drawing depicting a cross section of an apparatus 1000A including cooling means 1008 and heating means 1009 for separating the internal replica 1005 from a patterning fixture (or support cylinder) 1001 by differential thermal expansion/contraction, in accordance with a further embodiment.

Cooling mean 1008 such as cooling coils heating means 1009 such as heating elements are included for application of a heat flux (a flow of heat into or out of the adjacent structure/material). Introduction of a heat flux to either or both of the support cylinder 1001 and replica sleeve 1005 can cause differential thermal expansion/contraction, causing a radial clearance between the sleeve 1005 and support cylinder 1001. For example, simultaneous cooling of the inner component (e.g., support cylinder 1001) and heating of the outer component (e.g., sleeve layer 1004) may be employed to reduce the outer diameter (OD) and increase the inner diameter (ID) of the respective parts, causing the parts to separate due to differential expansion/contraction.

Heating or cooling alone may be used when the respective materials of the support cylinder and first layer have suitable differences in coefficients of thermal expansion. When sufficient clearance has been achieved, the inner and outer elements may be separated, e.g., by using a precision centralizing shaft and precision bearing surface along which the inner or outer element is guided in order to eliminate or minimize contact of the two surfaces. This separation technique applies to both the internal and external replica process.

FIG. 10B is a schematic drawing depicting the apparatus of FIG. 10A with the internal replica 1001 mounted on a centralizing fixture and partially separated from the outer fixture. The centralizing fixture can include end element 1020, centralizing shaft, and centralizing elements 1032, 1033. The movement of the sleeve 1005 away from the support cylinder 1001 for the separation process is indicated by the arrow shown.

After separation, the separated sleeve, e.g., sleeve 1005 in FIG. 10B, may be used without further processing as a master drum or replication tool for roll-to-roll (R2R) processes. Alternatively, the separated sleeve may be subjected to post processing, e.g., for cleaning, additional hardening, or application of a release layer to aid in the subsequent R2R process. Such cleaning process may involve rinsing with the appropriate solution(s) to remove residual dissolved photopolymer, electrolyte, lubricant, etc. The cleaning process may also include other cleaning steps, such as chemical stripping (of the parting and/or plating starting layers) or plasma stripping/cleaning etc., or other such cleaning processes.

In accordance with another aspect of this disclosure, the sleeve containing the desired relief pattern may be further treated in order to impart additional benefits in the subsequent manufacturing process. Exemplary embodiments use known radiation or chemical cross-linking techniques to harden the finished patterning tool. Hardening can be beneficial, particularly when the patterned tool includes a polymeric material. For either polymeric tools or metallic tools, or for other types of material as well, post-processing may also be used to assist in reducing adhesion between the tool and the polymer film into which its pattern is being transferred (e.g., embossed).

Clean separation of the tool and the film is desirable for reducing "clogging" or contamination of the patterning tool. For roll-to-roll (R2R) manufacturing, a useful release overcoat can be achieved by application of specific layers of atmospheric, vacuum, CVD, electrolytic, etc., coating processes. Suitable components for such a release overcoat, include, but are not limited to, PTFE [Teflon®], chrome, gold, inorganic oxide, or other materials. A release overcoat can include appropriate adhesion sublayers that are known to reduce adhesion to polymeric substrates.

A replication tool sleeve according to embodiment of the present disclosure, e.g., FIGS. 1-10, may be mounted in a rotary manufacturing machine using suitable apparatus and/or techniques. Suitable methods/apparatus may include an expansion arbor bonded to an inner centralizing sleeve using a gap-filling adhesive, or by other suitable methods and/or apparatus. An example of a suitable air-activated, compressed rubber or polymer expansion arbor is shown and described for FIG. 11.

Figure 11:
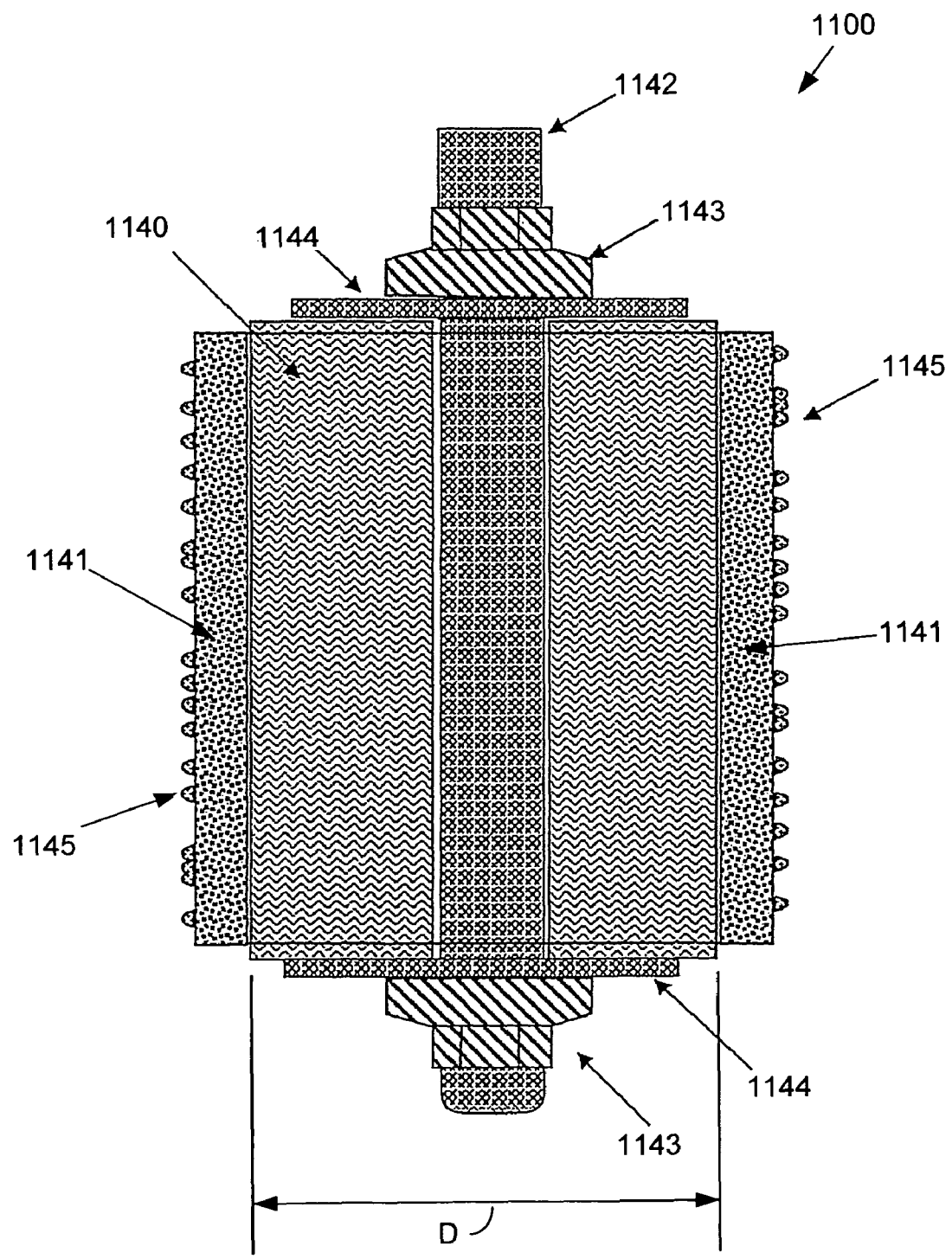
FIG. 11 is a schematic drawing depicting a cross section of a replication tool including a support fixture, in accordance with a further embodiment.

FIG. 11 shows a replication tool 1100 according to the present disclosure, including a support fixture and an expansion arbor 1140. A thick-walled cylindrically-shaped elastomeric insert piece 1140 is inserted into sleeve 1141 over shaft 1142 and compression nuts 1143 are tightened against thrust washer 1144 to compress elastomeric insert piece 1140. The resultant shortening of the length of the insert piece 1140 causes its outer diameter to concomitantly expand, thereby firmly capturing and securing tool sleeve 1141. Removal of the tool sleeve 1141 from the mounting fixture is accomplished by reversing this tightening process. The finished tool 1100 may be suitable for use in replication machinery, and may allow rapid changing of the tool sleeve. The tool 1100 may minimize the potential for contacting or otherwise damaging the outer surface holding the relief pattern 1145 during the mounting process.

The support fixture shown in FIG. 11 can be used for the extraction of a sleeve (from a deposition cell, e.g., cell 700B of FIG. 7B, or support fixture, e.g., 900B shown in FIG. 9B. For example, the insert piece 1140 may be inserted with the bore formed by the inner surface of the plating forming the replication tool. The associated compression nuts can be tightened so the insert piece 40 is pressed against and holds the replication tool sleeve.

As a portion of the substrate or first layer is removed, e.g., by a suitable solvent or developer, the support fixture holds the replication tool sleeve 1141 and prevents damage to the pattern 1141 on the outside surface of the tool sleeve 1141, forming a completed replication tool that is suitable to imprint or pre-format desired media such as optical recording media.

Figure 12:
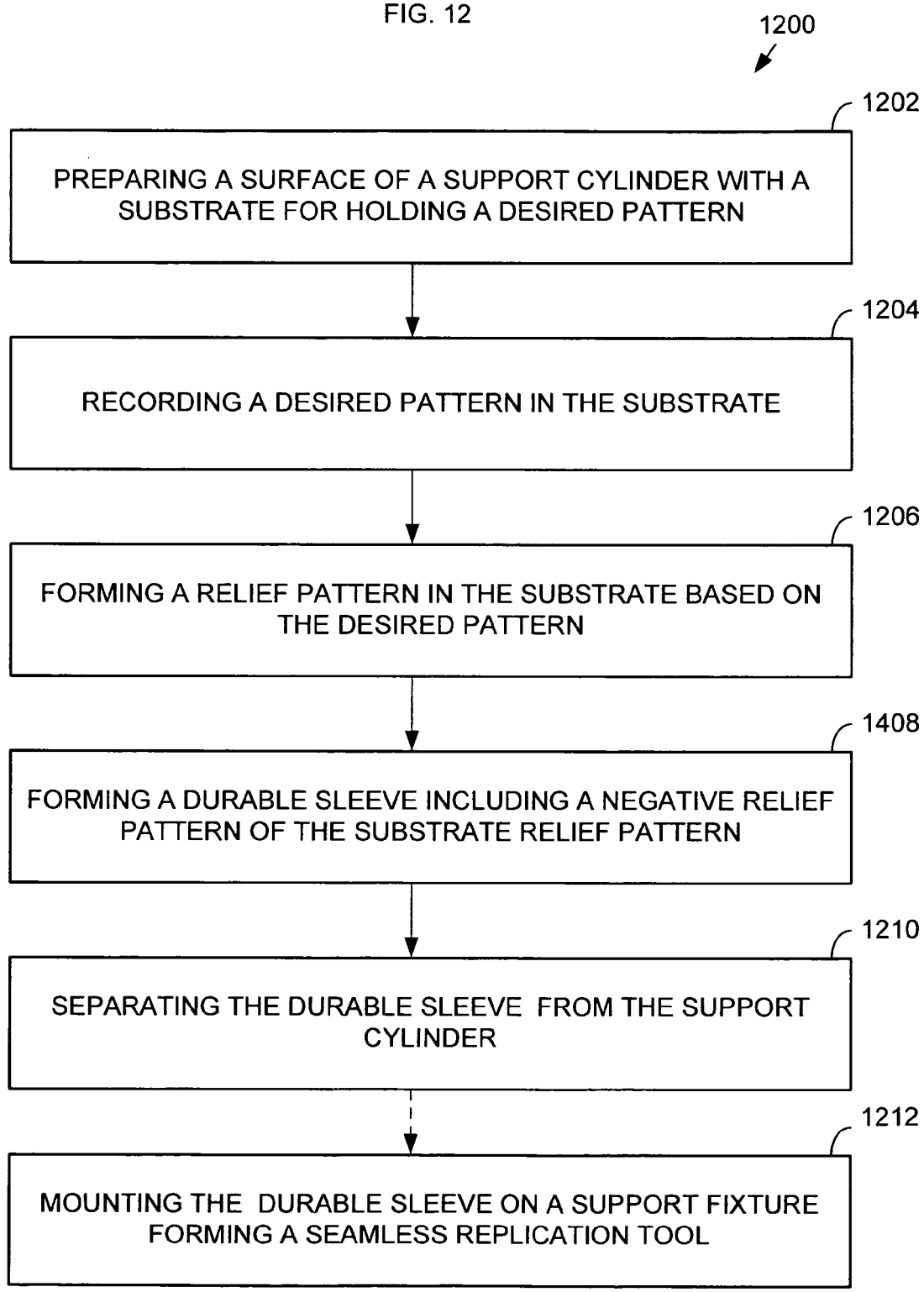
FIG. 12 is a diagram depicting a method of fabricating a seamless replication tool, in accordance with a further embodiment of the present disclosure.

FIG. 12 is a diagram depicting steps in a method 1200 of fabricating a seamless replication tool according to a further embodiment of the present disclosure. An inner surface of a support cylinder is prepared for holding a desired relief pattern, as described at 1202.

In an exemplary embodiment a light-sensitive polymer in the form of a photoresist fluid, such as previously mentioned, is poured in excess onto the inner wall of the support cylinder from the top opening such that the photoresist completely covers the inner wall below the top opening and is allowed to flow downward by gravity until a continuous film is formed.

The layer thickness (e.g., as shown by layer 102 in FIG. 1) can be controlled by adjusting the weight ratio of solid material to diluent (solvent) in the photoresist composition. The evaporation of the diluent component of the resist, and hence the drying time, can be modulated as necessary to achieve a smooth surface by control of the ambient temperature or control of the solvent vapor pressure (by, for example, partially sealing the support structure against evaporation), which will effect the thickness and surface quality, among other things, of the photoresist layer. After sufficient drying time, the final preparation of the photoresist may involve heating or baking as required by the particular material.

A desired pattern may be formed or recorded in the substrate as described at 1204. In exemplary embodiments, radiation is applied to the substrate by computer-controlled motion of a movable radiation source producing a laser output within the support cylinder, e.g., as shown and described for FIGS. 4A-B.

In certain embodiments, translation of a radiation head assembly used at 1204 to apply radiation may be accomplished by means of a linear actuator, which may be controlled by a position controller. Further, in an exemplary embodiment, the support cylinder with photoresist coating can be rotated about its central shaft while simultaneously translating an optical head along the direction of the axis of the cylinder. During this motion, the output of the optical head of an optical source (e.g., laser) can be modulated to produce the desired pattern by exposure of the photoresist. The rotation, translation, and laser control may be synchronized and programmed through master controller device, which may include a programmable logic controller (PLC), or computer, or the like.

The recording of the desired pattern, described at 1204, may include other sources and configurations of light or radiation delivery and exposure of the photoresist, including the use of gas and/or solid state lasers, electron beams, focused ion beams, light emitting diodes (LEDs), incoherent light sources, fiber optic devices, and the like. Other configurations for recording a desired pattern on the photoresist are also envisioned by this disclosure, including relaying of the beam along the direction of the rotation axis of the cylinder to an assembly which re-directs and focuses the beam to the surface of the photoresist.

It is also possible that both rotation and translation can be accomplished by movement of only the light head or source (either directly or as relayed by mirrors, etc.), or accomplished by rotation and translation of the cylinder only, or various combinations of the movements of the cylinder and the head or laser.

A relief pattern may be formed from the desired pattern, as described at 1206. Suitable methods for forming the relief pattern include applying a developer or solvent to the substrate to remove desired portions of the substrate, leaving the desired pattern in relief. Other suitable techniques may be used to recording the desired pattern may be used, such as laser ablating of material deposited on the sleeve surface, etc.

Continuing with the description of method 1200, a hard and durable layer (e.g., of a suitable metal) may be applied over the substrate and relief pattern, as described at 1208, to form a durable and seamless replication tool sleeve. This application of the durable layer serves to form a mirror-image or negative relief pattern of the pattern on the substrate in a durable surface that is suitable for use in preformatting optical media. In exemplary embodiments, applying a hard and durable sleeve layer includes forming a continuous layer of electrically conductive material on the substrate of the support cylinder and then plating the substrate by an electroplating or electrodeposition process, e.g., as described for FIG. 7A.

Application of the durable layer may be accomplished by other suitable techniques including, for example, electroless plating, electrolytic plating, electroforming, physical vapor deposition, chemical vapor deposition, epoxy replication, radiation cross-linking, casting, etc. Furthermore, it should be appreciated that any internally-patterned cylinder can be used as the pattern from which the desired tool is produced. Thus for example an internally-patterned Ni cylinder can be used to produce an externally-patterned Ni tool.

In exemplary embodiments, apparatus according to the embodiment described for FIG. 7A may be used for an electrodeposition process at 1208. For an electrodeposition process, the patterned surface of the resist may be made electrically conductive in order to serve as an electrode in the electrical circuit. Creation of a conductive surface over the (non-conductive) photoresist pattern can be achieved by suitable techniques including, for example, vacuum deposition, chemical reduction, chemical vapor deposition, etc. Such a conductive layer can be made of silver, gold, chrome, nickel, or any compatible conductive material or alloy, and is of such a thickness so as to ensure an electrically continuous layer, as necessary to obtain faithful pattern reproduction in the electroforming process. In other embodiments, the durable replica may be made by electroless deposition techniques, for example, electroless deposition of nickel (Ni) by immersion, etc.

After the durable layer including the negative relief pattern is made, the durable layer or sleeve may be removed or separated from the support cylinder, as described at 1210. In an exemplary embodiment, a centralizing element (e.g., element 1052 in FIG. 10B) and end element (e.g., element 1020 in FIG. 10B) may be used to hold the sleeve and support cylinder. This is one of several possible embodiments of an assembly that insures precise alignment of the axes of the sleeve in the cylinder, which thereby prevents damage to the outer pattern of the replica during the process of separation of replica tool from cylinder.

The step of separating 1210 the durable layer from the support cylinder may include introducing a suitable solvent (e.g., a photoresist solvent or photoresist developer) to the space between the outer tool surface and the inner wall of the support sleeve (the space occupied by the photoresist, e.g., region 934 in FIG. 9A). After the solution has penetrated and dissolved the photoresist, the tool sleeve may be separated by a sliding assembly on the shaft. Any residual photoresist or other contaminant material can be removed from the external patterned surface of the replication tool by cleaning as necessary.

By centering the sleeve and the support cylinder about the same central axis and then separating the sleeve and cylinder apart along this axis, damage to the relief pattern on the sleeve surface can be prevented or minimized for the separation process. Separating the replication tool from the support cylinder may include cooling or heating the support cylinder or replication tool to cause differential expansion between the supports cylinder and replication tool. An expandable arbor, e.g., an inflatable elastomeric device or a mechanical expansion device, etc., or other mounting fixture may be used for the separation process.

The seamless replication tool sleeve may be mounted on a support fixture, as described at 1212, to form a replication tool for imprinting the relief pattern on a desired medium, such as used for optical recording and data storage media. In an exemplary embodiment, a thick-walled cylindrically-shaped elastomeric insert piece, e.g., piece 1140 of FIG. 11, may be inserted into the bore formed by the inner surface of the durable layer of the replication tool. The insert piece may be placed around a support shaft. Compression nuts may be tightened against respective thrust washers to compress an elastomeric insert piece. The resultant shortening of the length of the insert piece causes its outer diameter to concomitantly expand, thereby firmly capturing and securing the tool sleeve. Removal of the tool from the mounting fixture is accomplished by reversing this tightening process.

Figure 13:
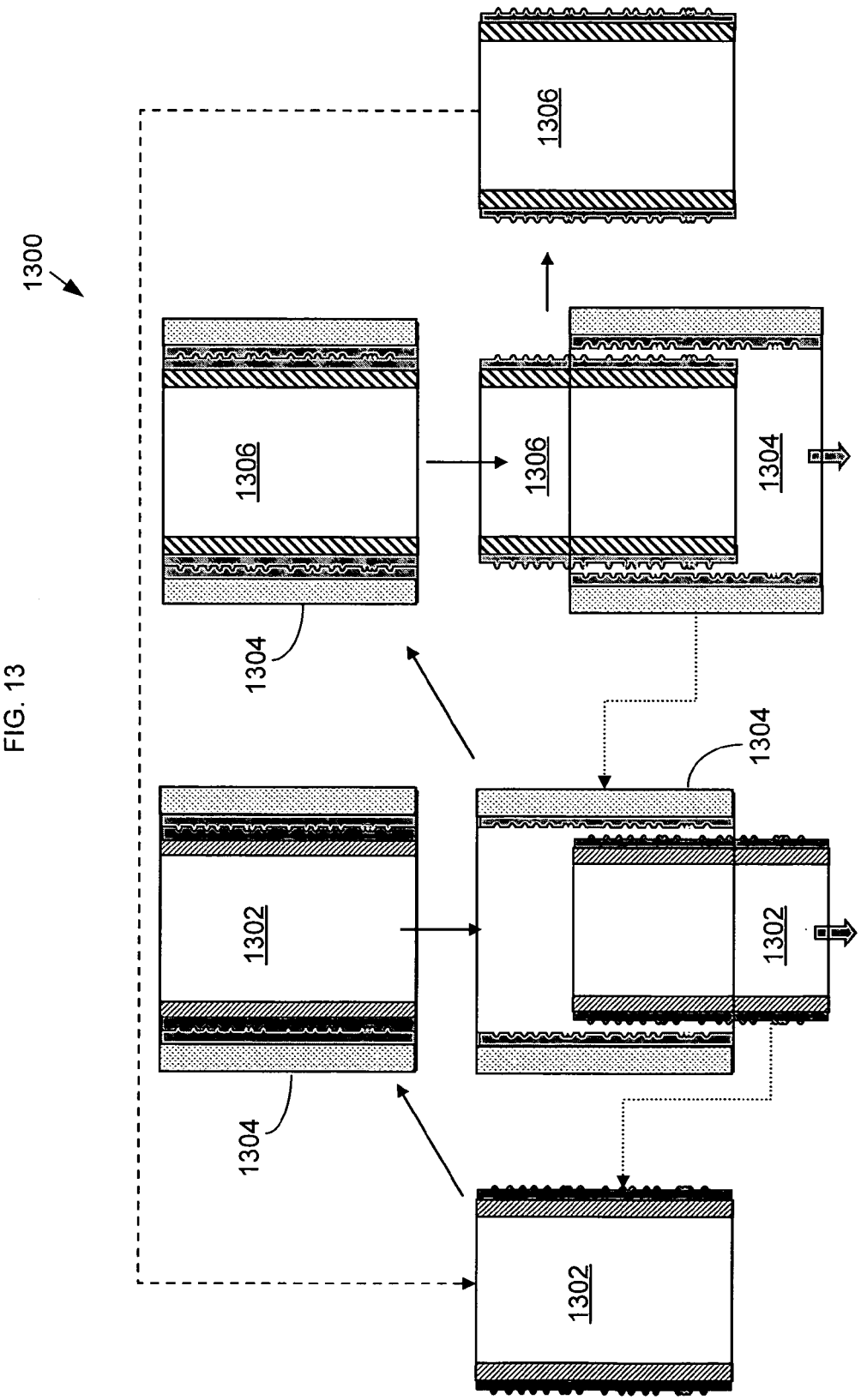
FIG. 13 is a process flow chart for formation of replication tools for cases of external and internal master drums, or replication tools, in accordance with further embodiments of the disclosure.

FIG. 13 is a process flow chart for the formation of replication tool according to the present disclosure for both external and internal master drums. As is indicated in FIG. 13, embodiments of the present disclosure can provide the ability to fabricate one or more master drums or replication tools from a single, original master pattern, whether internal or external type. This ability cab be particularly beneficial for the production of a number of identical replication sleeves, or when the "turn-around" time for producing another master pattern is too long or the cost too high to be viable for the production process.

FIG. 13 is a process flow diagram illustrating the formation 1300 of multiple replica patterning sleeves and replication tools, in accordance with embodiments of the present disclosure. The pattern formed (e.g., 1302, 1306) may be used in a roll-to-roll (R2R) replication process directly and without regard as to whether an intermediary replication process was involved.

The process 1300 can start with either a negative internal pattern (i.e., external master pattern) 1302 or a positive internal pattern 1304, where positive refers to the geometry being that of the master pattern and the finished replica (tool sleeve) having the same symmetry when viewed from the patterned surface. A positive internal pattern 1304 can be formed directly from a patterned internal surface of a support cylinder, e.g., cylinder 401 of FIG. 4A, or as a result of replication of a negative internal drum, e.g., drum 1302. Similarly, a negative internal pattern 1302 can be formed directly from a patterned external surface of a support cylinder, e.g., cylinder 401 of FIG. 4B, or as a result of replication of a negative external drum, e.g., drum 1304 using methods/apparatus of the present disclosure.

Positive internal pattern 1304 can be used to form a number of negative internal drums, e.g., drum 1306, by formation methods/apparatus according to the present disclosure, e.g., shown and described for FIGS. 2-12. In exemplary embodiments, Ni deposition methods/apparatus, e.g., shown and described for FIGS. 4A-B, can be used to form a negative internal drum 1310. In further exemplary embodiments, polymer application methods/apparatus, e.g., shown and described for FIGS. 8A-D, can be used to form a negative internal drum 1310.

Drum 1306 may be separated from drum 1304 by suitable methods/apparatus according to the present disclosure. For example, thermal differential expansion/contraction shown and described for FIGS. 10A-B may be used for the separation of drum 1306 from drum 1304. In exemplary embodiments including polymers or polymeric compounds, chemical stripping may be used to dissolve portions of such for the removal of drum 1304.

Accordingly, the previous descriptions illustrate that embodiments of the present disclosure provide durable seamless replication tools useful for the replication of desired relief patterns on recording media, or data storage substrates, including optical recording media. Replication tools according to exemplary embodiments may include desired relief patterns with features on a micron and/or nanometer scale. Further embodiments of the present disclosure may provide methods and/or apparatus for fabricating such seamless replication tools.

While certain embodiments have been described herein, others may be practiced within the scope of the present disclosure. For example, in addition to the embodiments described previously, a tool sleeve can be affixed to a support insert by suitable adhesives to bond the inner tool surface to the outer surface of a centralized sleeve, brazing or welding, press-fitting, thermal shrink-fitting, etc. Furthermore, while an optical head with a laser inside of a support cylinder has been described, a desired pattern on (or in) photoresist may be recorded by other suitable techniques, including relaying of an optical beam along the direction of the rotation axis of a support cylinder to an assembly which re-directs and focuses the beam on the surface of the photoresist.

It is also possible that both rotation and translation can be accomplished by movement of only the light source (either directly or as relayed by mirrors, etc.), or accomplished by rotation and translation of the cylinder only, or various combinations of the movements of the cylinder and the head or laser. Moreover, it will be appreciated that, although certain embodiments have been described herein in the context of imprinting structures on data storage substrates, embodiments of the present disclosure may be used for other applications including, but not limited to, holographic replication, microimprint, and nanoimprint lithography and microscopic printing processes, to name a few examples.

Moreover, while the previous description has included reference to seamless cylindrical substrates (SCS) and support cylinders that are in the form of circular cylinders, the scope of the present disclosure includes SCS and support cylinders having other types of cylindrical shapes, e.g., elliptical cylinders.

Accordingly, the methods, systems, and apparatus of the present disclosure may be embodied in other specific forms without departing from the spirit thereof. The present embodiments are therefore to be considered in all respects as illustrative and not restrictive, the scope of the disclosure being indicated by the appended claims rather than by the foregoing description, and all changes that come within the meaning and range of equivalency of the claims are therefore intended to be embraced therein.

What is claimed is:

1. An electroplating system for making a pattern replication tool sleeve including a negative relief of a desired pattern on a cylindrical surface, the system comprising:

a support cylinder, wherein the support cylinder has a relief pattern disposed on a surface;

a cylinder having first and second open ends and configured to hold the support cylinder;

first and second disks disposed within the first and second open ends of the cylinder, respectively, and adapted to seal the first and second ends of the cylinder in a fluid-tight configuration, respectively; and a recirculating system configured and arranged to pump a metal-containing solution through the support cylinder for depositing metal onto the inner surface of the substrate on the support cylinder.

2. The system of claim 1, further comprising an electrical circuit connecting the cylinder and one of the first and second disks to a power supply configured to supply current for electroplating the recording substrate on the inner surface of the support cylinder.

3. The system of claim 1, wherein the recirculating system comprises a reservoir for holding the metal-containing solution, wherein the reservoir is fluidically connected to the cylinder.

4. The system of claim 1, wherein the recirculating system further comprises a pump configured to pump the electrolyte solution within the recirculating system.

5. The system of claim 1, wherein the recirculating system further comprises an in-line filtration systems operable to remove particulate matter from the metal-containing solution.

6. The system of claim 3, wherein the recirculating system further comprises heating elements by which the solution in the reservoir is caused to reach and maintain a desired operating temperature.

7. The system of claim 2, wherein the electrical circuit comprises a first electrode disposed through the cylinder and electrically connected to the power supply and the cylinder, and a second electrode disposed through the first disk and electrically connected to the power supply.

8. The system of claim 7, wherein the second electrode comprises a plurality of nickel pellets disposed in a titanium basket disposed within the cylinder between the first and second disks.

9. The system of claim 7, wherein the second electrode is surrounded by a filter bag to retain particulates produced as byproducts of an electroplating process.

10. The system of claim 9, wherein the second electrode comprises a solid metallic rod or bar.

11. The system of claim 7, wherein the first electrode comprises a conductive layer disposed on the inner surface of the support cylinder.

12. The system of claim 1, wherein the metal-containing solution comprises an electroless immersion liquid.

13. The system of claim 2, wherein the metal-containing solution comprises an electroplating electrolyte.

* * * * *